United States Patent
Miyata

(10) Patent No.: US 12,267,922 B2
(45) Date of Patent: Apr. 1, 2025

(54) LIGHT-EMITTING DEVICE, DISPLAY DEVICE, AND LED DISPLAY DEVICE

(71) Applicant: Sharp Display Technology Corporation, Kameyama (JP)

(72) Inventor: Hidekazu Miyata, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 162 days.

(21) Appl. No.: 18/195,028

(22) Filed: May 9, 2023

(65) Prior Publication Data

US 2023/0397310 A1 Dec. 7, 2023

(30) Foreign Application Priority Data

Jun. 1, 2022 (JP) .................. 2022-089726

(51) Int. Cl.
| | |
|---|---|
| *H05B 45/30* | (2020.01) |
| *G02F 1/1335* | (2006.01) |
| *G02F 1/13357* | (2006.01) |
| *H01L 25/075* | (2006.01) |
| *H05B 45/10* | (2020.01) |
| *H05B 45/46* | (2020.01) |

(52) U.S. Cl.
CPC ....... *H05B 45/30* (2020.01); *G02F 1/133603* (2013.01); *G02F 1/133612* (2021.01); *H01L 25/0753* (2013.01); *H05B 45/10* (2020.01); *H05B 45/46* (2020.01)

(58) Field of Classification Search
CPC ........ H05B 45/30; H05B 45/10; H05B 45/46; H05B 45/44; H05B 45/50; G02F 1/133603; G02F 1/133612; G02F 1/133601; H01L 25/0753; G09G 3/3291; G09G 2320/0209; G09G 3/32; G09G 3/3216; Y02B 20/40
See application file for complete search history.

(56) References Cited

U.S. PATENT DOCUMENTS

| | | | |
|---|---|---|---|
| 10,630,168 B1 * | 4/2020 | Wang | ................. H02M 1/4208 |
| 10,935,843 B2 * | 3/2021 | Miyata | ............. G02F 1/133603 |
| 2003/0227278 A1 | 12/2003 | Sakuragi | |
| 2005/0200307 A1 * | 9/2005 | Chou | ................. H05B 41/2828 315/307 |
| 2020/0257167 A1 | 8/2020 | Miyata et al. | |

FOREIGN PATENT DOCUMENTS

JP 2004-046088 A 2/2004

* cited by examiner

*Primary Examiner* — Minh D A
(74) *Attorney, Agent, or Firm* — ScienBiziP, P.C.

(57) ABSTRACT

An anode line control circuit provided corresponding to each of anode lines includes a first resistor connected to a control terminal of a first switching element, which controls the supply of a power supply voltage to the anode line, and a second switching element connected to a second resistor connected to one end of the anode line. When the first switching element changes from an OFF state to an ON state, the second switching elements corresponding to the anode lines other than the anode line connected to the first switching element are maintained in the OFF state.

8 Claims, 36 Drawing Sheets

LIGHT-EMITTING DEVICE, DISPLAY DEVICE, AND LED DISPLAY DEVICE

CROSS-REFERENCE TO RELATED APPLICATIONS

This application claims the benefit of priority to Japanese Patent Application Number 2022-089726 filed on Jun. 1, 2022. The entire contents of the above-identified application are hereby incorporated by reference.

BACKGROUND

Technical Field

The following disclosure relates to a light-emitting device having an LED as a light source, a display device using the light-emitting device as a backlight, and an LED display device including the light-emitting device.

In a transmissive liquid crystal display device, a backlight (light-emitting device) for emitting light from a back surface of a display portion (liquid crystal panel) is required for displaying an image. In many cases, a cold cathode tube known as CCFL is used as a light source for known backlights. However, in recent years, light emitting diodes (LEDs) are increasingly used due to their features such as low power consumption and easy luminance control.

With respect to such liquid crystal display devices as described above, in order to achieve a reduction in power consumption, a technique known as "local dimming" is developed. With the technique, a screen is logically divided into a plurality of areas, and the luminance (light emission intensity) of the LEDs is controlled for each area. For example, according to the local dimming, the luminance of each of the LEDs is determined based on a maximum value, an average value, and the like of input gray scale values of pixels included in the corresponding area. In this manner, each of the LEDs is turned on at the luminance corresponding to an input image in the corresponding area.

Incidentally, in recent years, the development of LEDs that are much smaller than LEDs in the related art, such as LEDs known as "mini LEDs" and "micro LEDs" is actively being pursued. By employing a backlight that performs local dimming using such extremely small LEDs, it is expected to divide a display region of a display device into a greater number of areas. However, in such a case, when attempting to drive the LEDs for each area, the number of wiring lines becomes enormous. Therefore, a method called "passive driving (time division driving)" is proposed in which the LEDs mounted on a LED substrate are divided up into a plurality of blocks, and the LEDs are driven for a block at a time using time division.

FIG. 27 is a circuit diagram schematically illustrating a configuration example of a backlight that performs passive driving. Note that, here, attention is paid to a case in which there are 16 (4×4) areas and one LED 952 is provided in each area. The backlight illustrated in FIG. 27 includes an LED drive circuit 930, a switching circuit 940, an illumination unit 950, and an LED power supply 960. The LED power supply 960 supplies a power supply voltage for driving the LEDs. The LED drive circuit 930 includes four outputs, and constant current sources 932 and switches 934 are provided so as to correspond to the four outputs, respectively. In the illumination unit 950, one of the LEDs 952 is provided for each area. One row in the illumination unit 950 illustrated in FIG. 27 corresponds to one block. In other words, there are four blocks in this example.

In such a configuration as described above, using time division, the switching circuit 940 switches the supply destination of a power supply voltage between the four blocks, during one lighting period (a period having a length corresponding to a cycle during which each of the LEDs 952 is set to a lighting-enabled state). In other words, in the passive driving, the one lighting period is divided into a plurality of sub-lighting periods, and in each of the sub-lighting periods, the LEDs 952 of the block (row) corresponding to the sub-lighting period are turned on. In this example, as illustrated in FIG. 28, the one lighting period is divided into four sub-lighting periods T91 to T94, and the LEDs 952 are turned on for one block at a time. Note that, in practice, when the one lighting period is divided into the plurality of sub-lighting periods, a unit of the LEDs to be driven is not limited to one row. The LEDs may be driven for a plurality of rows at a time, or, for example, the LEDs may be driven for an area at a time, the area being divided into left and right areas. By employing such passive driving as described above, an increase in the number of area divisions is achieved.

However, when passive driving is employed, an LED that is to be turned off may be faintly turned on (in other words, erroneous lighting may occur). This will be described below. For example, it is assumed that a plurality of the LEDs are arranged in a matrix shape, one row corresponds to one block, and one output of an LED drive circuit that drives the plurality of LEDs is connected to one column of the LEDs (see FIG. 27). Further, it is also assumed that the LEDs are driven for one block at a time (for one row at a time) in the up-down direction when the LED substrate is viewed in a plan view. In such a case, when driving is performed so that only one of the LEDs is turned on and the other LEDs are turned off, the LED located in the same column as the LED to be turned on and located above the LED to be turned on may be faintly turned on. Hereinafter, in the present specification, this phenomenon will be referred to as "first type abnormal lighting" for convenience.

A technique for preventing the occurrence of first type abnormal lighting is disclosed in US 2020/0257167 A. According to this technique, a discharge control circuit corresponding to each block is provided in a backlight so that an anode voltage of the LED included in each block quickly decreases after a lighting-enabled period (a sub-lighting period corresponding to each block) of the LED included in each block ends.

Further, JP 2004-46088 A discloses a technique for preventing the occurrence of erroneous lighting. According to this technique, an LED display device is provided with an erroneous lighting prevention circuit that includes a discharging path through which a residual charge is discharged from a charging element to a ground end in a driving state. As a result, when a certain LED is supposed to be turned off during the lighting-enabled period of that LED, the lighting of that LED due to a residual charge is prevented.

SUMMARY

According to the technique disclosed in US 2020/0257167 A, the occurrence of first type abnormal lighting can be prevented. However, for example, in the above-described case (see FIGS. 27 and 28), a certain LED that is to be turned off (hereinafter referred to as an "LED of interest") may be faintly turned on due to a change in the voltage of an anode line (a line connected to the anode of the LED), regardless of whether an LED to be turned on is present in the same column as the LED of interest. Hereinafter, in the present specification, this phenomenon will be referred to as "second type abnormal lighting" for convenience.

Second type abnormal lighting will be described. Here, attention is paid to a case in which the LEDs of four rows are divided up into four blocks so that one row corresponds to one block, and in which a configuration of a portion including a switching circuit 90 that switches the supply destination of a power supply voltage (a power supply voltage for driving the LEDs) VLED between the four blocks, and LEDs 9(1) to 9(4) of one column is a configuration as illustrated in FIG. 29. In the example illustrated in FIG. 29, FETs 901 and resistors R are provided in the switching circuit 90 so as to correspond to each block (each of anode lines AL). The FET 901 is switched between an ON state and an OFF state based on a control signal S. Based on control signals S(1) to S(4), four FETs 901(1) to 901(4) are sequentially turned on for a predetermined period at a time, and as a result, the LEDs 9(1) to 9(4) in the first to fourth rows are sequentially set to the lighting-enabled state for the predetermined period at a time.

FIG. 30 illustrates waveforms of an anode voltage V_AL of the LED of interest (a voltage of the anode line connected to the LED of interest) and of a voltage V_PD of a photodiode that receives light from the LED of interest. A period T9 during which the value of the voltage V_PD of the photodiode is low is a period during which the LED of interest is turned on. It is understood from FIG. 30 that the LED of interest is turned on at a time of rising of the anode voltage V_AL of the LED of interest.

With respect to the configuration illustrated in FIG. 29, when the FET 901(1) is in the ON state, the power supply voltage VLED is applied to an anode line AL(1), and a current corresponding to an output setting of the LED drive circuit 91 flows through the LED 9(1). However, when the output setting of the LED drive circuit 91 is a lighting-off setting, ideally, no current flows through the LED 9(1), and the LED 9(1) is not turned on. When the FET 901(1) changes from the ON state to the OFF state, a flow of a charge occurs in the resistor R(1), and the voltage of the anode line AL(1) decreases. As a result, regardless of the output setting of the LED drive circuit 91, no current flows through the LED 9(1).

When the output setting of the LED drive circuit 91 for the LED 9(1) is the lighting-off setting, the cathode of the LED 9(1) and the LED drive circuit 91 are electrically disconnected from each other. Therefore, even if the power supply voltage VLED is applied to the anode line AL(1), ideally, the LED 9(1) is not turned on as described above.

Incidentally, when passive driving is not employed (when the LEDs are driven one at a time by a configuration illustrated in FIG. 31), second type abnormal lighting does not occur. FIG. 32 illustrates waveforms of a current Id flowing through an LED 9a illustrated in FIG. 31 and the anode voltage V_AL of the LED 9a when the passive driving is not employed. It is understood from FIG. 32 that the current Id is maintained at 0 regardless of the changes in the anode voltage V_AL of the LED 9a.

When passive driving is employed (however, it is assumed that the configuration illustrated in FIG. 29 is employed), for example, during a period in which the FET 901(1) is maintained in the ON state and the power supply voltage VLED is applied to the anode line AL(1), with respect to the LEDs of one column illustrated in FIG. 29, no current flows through the LED 9(2) to 9(4) other than the LED 9(1). At this time, the LED 9(2) to 9(4) each have a property (a property of holding the charge at both ends of an element) similar to that of a capacitor. Further, a parasitic capacitance is present between respective terminals of the FET 901. Here, when it is assumed that an LED of the first row is the above-described LED of interest (LED that is to be turned off), waveforms of a current Idl flowing through the LED of interest and of an anode voltage V_AL(1) of the LED of interest are as illustrated in FIG. 33. It is understood from a portion denoted by a reference sign 97 in FIG. 33 that at a time of rising of the anode voltage V_AL(1), a very small amount of current flows through the LED of interest due to the voltage variation. Note that FIG. 34 is an enlarged view of the portion denoted by the reference sign 97 in FIG. 33. The value of the current Idl flowing through the LED of interest increases at the rising phase of the anode voltage V_AL(1), and then gradually decreases. For example, the peak value of the current Idl flowing through the LED of interest is approximately 1 mA, and it takes 1 to 2 microseconds for the current Idl to decrease from 1 mA to 0 mA. However, the magnitude of the current Idl flowing through the LED of interest (LED 9(1)) changes depending on the capacitance values of the capacitance components of the LEDs 9(2) to 9(4). Hereinafter, the current unnecessarily flowing through the LED to be turned off may be referred to as an "unnecessary current".

The reason why such an unnecessary current is generated is as follows. Since the LED 9(1) (LED of interest) in the above-described example is the LED to be turned off, even if the power supply voltage VLED is applied to the anode line AL(1), the cathode of the LED of interest and the LED drive circuit 91 are electrically disconnected from each other, and thus no current flows through the LED drive circuit 91. Therefore, the charge is accumulated in the capacitance components of the LED 9(2) to 9(4). In this regard, the charge is accumulated on the cathode side of each of the LEDs 9(2) to 9(4) in accordance with the degree of increase in the anode voltage V_AL(1), and the charge having the opposite polarity to that of the above-described charge is accumulated on the anode side of each of the LEDs 9(2) to 9(4). Accordingly, the charge is also accumulated in the parasitic capacitances of the FET 901(2) to 901(4). Anode lines AL(2) to AL(4) are connected to the ground via resistors R(2) to R(4), respectively. As described above, the current flows through the LED 9(1) at the rising phase of the anode voltage V_AL(1), and the LED 9(1) is faintly turned on although the LED 9(1) is to be turned off. Further, a very small amount of current arising from the variation in the voltages of the anode lines AL(2) to AL(4) also flows through the LED 9(1). This also contributes to the faint lighting of the LED 9(1).

FIG. 35 illustrates waveforms of the current Idl flowing through the LED of interest, and of anode voltages V_AL(1) to V_AL(n) of the LEDs of the first to n-th rows, in a realistic case in which the LED of the first row is the above-described LED of interest (LED to be turned off). As can be understood from portions denoted by reference signs 99a and 99b in FIG. 35, the current flows through the LED of interest at the rising phase of the anode voltage V_AL(1). Examples of specific values of the current and the like at this time are as follows. The forward voltage of the LED is 2.8 V, and the forward current of the LED is 9 mA. The resistance value of the resistor R is from 1 kΩ to 10 kS). The time required for the voltage of the anode line to fall is several tens of microseconds when the resistance value of the resistor R is 1 kΩ, and is several hundreds of microseconds when the resistance value of the resistor R is 10 kΩ. A current of approximately 1.5 mA flows through the LED of interest for a period of 1 to 2 microseconds. The same applies to a case in which the LEDs of the second to n-th rows are the above-described LEDs of interest (LEDs to be turned off).

When attention is paid to a first embodiment of US 2020/0257167 A (particularly see FIG. 6 and FIG. 10), the charge accumulated in an anode line (power supply line PL) is discharged when a switch 444 illustrated in FIG. 6 is turned on. Therefore, as a result of the switch 444 illustrated in FIG. 6 changing from the OFF state to the ON state, the voltage of the anode line decreases. In this regard, for example, when all the LEDs of a certain column are supposed to be turned off, a fall in the voltage of a certain anode line may cause a very small amount of current to flow through an LED connected to another anode line. Incidentally, each of waveforms illustrated in FIG. of US 2020/0257167 A is actually as illustrated in FIG. 36. Note that, in FIG. 36, the waveform of the current Idl flowing through the LEDs of the first row is added. It is understood from FIG. 36 that the current flows through the LEDs of the first row at the rising phase of a voltage V(PL1) of the anode line of the first row, and at the falling phase of voltages V(PL2) to V(PL4) of the anode lines of the second to fourth rows. As described above, the LED to be turned off may be faintly turned on. Similarly, in a second embodiment of US 2020/0257167 A (particularly see FIG. 12 and FIG. 13), an LED to be turned off may be faintly turned on.

As described above, when passive driving is employed, the above-described second type abnormal lighting may occur.

Further, according to the technique disclosed in JP 2004-46088 A, charging is performed to a capacitor (a capacitor provided in a charging/discharging path: a capacitor denoted by a reference sign Cl in FIG. 12 of JP 2004-46088 A) when lowering the anode voltage, and thus the time required for lowering the anode voltage becomes longer. Therefore, for example, when the LEDs to be driven are switched from the LEDs of the first row to the LEDs of the second row, the LEDs of the first row may be erroneously turned on as a result of the anode voltage of the LEDs of the first row not being sufficiently lowered immediately after the start of the lighting-enabled period for the LEDs of the second row. Further, although the charge of the capacitor is discharged when increasing the anode voltage, such an operation does not contribute to the prevention of the occurrence of the second type abnormal lighting.

In light of the circumstances described above, an object of the present disclosure is to realize a light-emitting device capable of suppressing the occurrence of abnormal lighting in which an LED to be turned off is faintly turned on due to a change in the voltage of an anode line.

(1) A light-emitting device according to some embodiments of the present disclosure is a light-emitting device using an LED as a light source.

The light-emitting device includes
a plurality of LED units each constituted by one or a plurality of LEDs, the plurality of LEDs being divided up into a plurality of blocks,
a plurality of power supply lines provided corresponding to the plurality of blocks in a one-to-one manner, and connected to upstream ends of the LED units included in the corresponding blocks,
a switching circuit configured to switch, between the plurality of power supply lines, a supply destination of a power supply voltage for driving the LEDs, to drive the plurality of LED units a block at a time,
a plurality of lighting control lines respectively connected to downstream ends of a number of the LED units equal to a number of the plurality of blocks, and
an LED drive circuit configured to control a current supplied to the LED included in each of the plurality of LED units, the LED drive circuit being connected to the plurality of lighting control lines.

The switching circuit includes a plurality of power supply line control circuits provided corresponding to the plurality of power supply lines in a one-to-one manner.

Each of the power supply line control circuits includes
a first switching element including a control terminal, a first conduction terminal to which the power supply voltage is applied, and a second conduction terminal connected to the corresponding power supply line,
a first resistor, a first control signal being applied to one end of the first resistor and the other end of the first resistor being connected to the control terminal of the first switching element,
a second switching element including a control terminal to which a second control signal is applied, a first conduction terminal, and a second conduction terminal to which a predetermined potential is applied, and
a second resistor, one end of the second resistor being connected to the corresponding power supply line and the other end of the second resistor being connected to the first conduction terminal of the second switching element.

When, of two of the power supply lines to which the power supply voltage is continuously supplied, the power supply line to which the power supply voltage is supplied first is defined as a first power supply line of interest, and of the two power supply lines, the power supply line to which the power supply voltage is supplied subsequently is defined as a second power supply line of interest, at a time at which the first switching element corresponding to the second power supply line of interest changes from an OFF state to an ON state based on the first control signal, a plurality of the second switching elements respectively corresponding to the plurality of power supply lines other than the second power supply line of interest are maintained in the OFF state based on the second control signals.

(2) Further, a light-emitting device according to some embodiments of the present disclosure includes the configuration (1) described above, and
when the supply destination of the power supply voltage is switched from the first power supply line of interest to the second power supply line of interest,
during a period from a time at which the first switching element corresponding to the first power supply line of interest changes from the ON state to the OFF state based on the first control signal to a time at which the first switching element corresponding to the second power supply line of interest changes from the OFF state to the ON state based on the first control signal, the plurality of second switching elements respectively corresponding to the plurality of power supply lines other than the second power supply line of interest change from the ON state to the OFF state based on the second control signals, and
during a period after a time at which the first switching element corresponding to the second power supply line of interest changes from the OFF state to the ON state based on the first control signal, the plurality of second switching elements respectively corresponding to the plurality of power supply lines other than the second power supply line of interest sequentially change from the OFF state to the ON state based on the second control signals.

(3) Further, a light-emitting device according to some embodiments of the present disclosure includes the configuration (1) described above, and when the supply destination of the power supply voltage is switched from the first power supply line of interest to the second power supply line of interest, during a period from a time at which the first switching element corresponding to the first power supply line of interest changes from the ON state to the OFF state based on the first control signal to a time at which the first switching element corresponding to the second power supply line of interest changes from the OFF state to the ON state based on the first control signal, after the second switching element corresponding to the first power supply line of interest changes from the OFF state to the ON state based on the second control signal, the plurality of second switching elements respectively corresponding to the plurality of power supply lines change from the ON state to the OFF state based on the second control signals, during a period after a time at which the first switching element corresponding to the second power supply line of interest changes from the OFF state to the ON state based on the first control signal, the plurality of the second switching elements respectively corresponding to the plurality of power supply lines other than the second power supply line of interest sequentially change from the OFF state to the ON state based on the second control signals, and the second switching element corresponding to the second power supply line of interest is maintained in the OFF state based on the second control signals during a period in which the power supply voltage is supplied to the second power supply line of interest.

(4) Further, a light-emitting device according to some embodiments of the present disclosure includes the configuration (1) described above, and when the supply destination of the power supply voltage is switched from the first power supply line of interest to the second power supply line of interest, during a period before a time at which the first switching element corresponding to the first power supply line of interest changes from the ON state to the OFF state based on the first control signal, the second switching element corresponding to the first power supply line of interest changes from the OFF state to the ON state based on the second control signal, during a period from a time at which the first switching element corresponding to the first power supply line of interest changes from the ON state to the OFF state based on the first control signal to a time at which the first switching element corresponding to the second power supply line of interest changes from the OFF state to the ON state based on the first control signal, the second switching element corresponding to the first power supply line of interest changes from the ON state to the OFF state based on the second control signal, and the second switching element corresponding to the first power supply line of interest is maintained in the OFF state based on the second control signal during a period excluding a predetermined period during which the supply destination of the power supply voltage is switched from the first power supply line of interest to the second power supply line of interest.

(5) Further, a light-emitting device according to some embodiments of the present disclosure includes the configuration (1) described above, and the switching circuit includes a plurality of adjustment circuits provided corresponding to the plurality of power supply line control circuits in a one-to-one manner, and each of the adjustment circuits generates, based on one adjustment signal, the first control signal and the second control signal supplied to the corresponding power supply line control circuit.

(6) Further, a light-emitting device according to some embodiments of the present disclosure includes the configuration (5) described above, and each of the adjustment circuits includes a first delay circuit configured to output a signal generated by delaying the adjustment signal by a first time period having a predetermined length, a first NOT circuit configured to output a logical inversion signal of the adjustment signal, an AND circuit outputting a signal representing a logical product of the signal output from the first delay circuit and the signal output from the first NOT circuit, a second delay circuit configured to output, as the second control signal, a signal generated by delaying the signal output from the AND circuit by a second time period having a predetermined length, and a second NOT circuit configured to output, as the first control signal, a logical inversion signal of the signal output from the first delay circuit.

(7) Further, a display device according to some embodiments of the present disclosure includes a display panel including a display portion configured to display an image; and the light-emitting device according to any one of the configurations 1 to 6, provided on a back surface of the display panel to emit light onto the display portion.

(8) An LED display device according to some embodiments of the present disclosure includes the light-emitting device including any one of the configurations (1) to (6) described above.

The plurality of LED units are classified into K types based on luminescent colors, and each of picture elements is constituted by the K types of the LED units.

According to a light-emitting device according to some embodiments of the present disclosure, a switching circuit that switches a supply destination of a power supply voltage for driving LEDs between a plurality of power supply lines includes a plurality of power supply line control circuits provided corresponding to the plurality of power supply lines in a one-to-one manner, and each of the power supply line control circuits includes a second switching element that functions as a switch for controlling an electrical connection state between the corresponding power supply line and a wiring line to which a predetermined potential is applied. Then, when a first switching element, which controls the supply of a power supply voltage to the power supply line, changes from an OFF state to an ON state, the second switching elements corresponding to the power supply lines other than the power supply line connected to the second conduction terminal of first switching element are maintained in the OFF state. Thus, when the LED connected to the power supply line to be driven is supposed to be turned off, the flow of a charge due to an increase in the voltage of that power supply line is suppressed. Further, in the switching circuit, one end of a first resistor is connected to a control terminal of the first switching element. As a result, when the LED connected to the power supply line to be driven is supposed to be turned off, the accumulation of the charge in parasitic capacitances of the first switching elements connected to the power supply lines other than the power supply line to be driven slows down, and the flow of the charge due to the increase in the voltage of the power supply line to be driven is suppressed. With the configuration described above, a light-emitting device is realized that can suppress the occurrence of abnormal lighting in which the LED to be turned off is faintly turned on due to a change in the voltage of the power supply line.

BRIEF DESCRIPTION OF DRAWINGS

The disclosure will be described with reference to the accompanying drawings, wherein like numbers reference like elements.

DESCRIPTION OF EMBODIMENTS

Embodiments will be described below with reference to the accompanying drawings. With respect to a second embodiment and a third embodiment, only points different from a first embodiment will be mainly described. Note that, with respect to lighting control of the LEDs, for convenience of explanation, attention is paid to a case in which all the LEDs are to be turned off.

1. First Embodiment

1.1 Overall Configuration and Operation Outline

Figure 2:
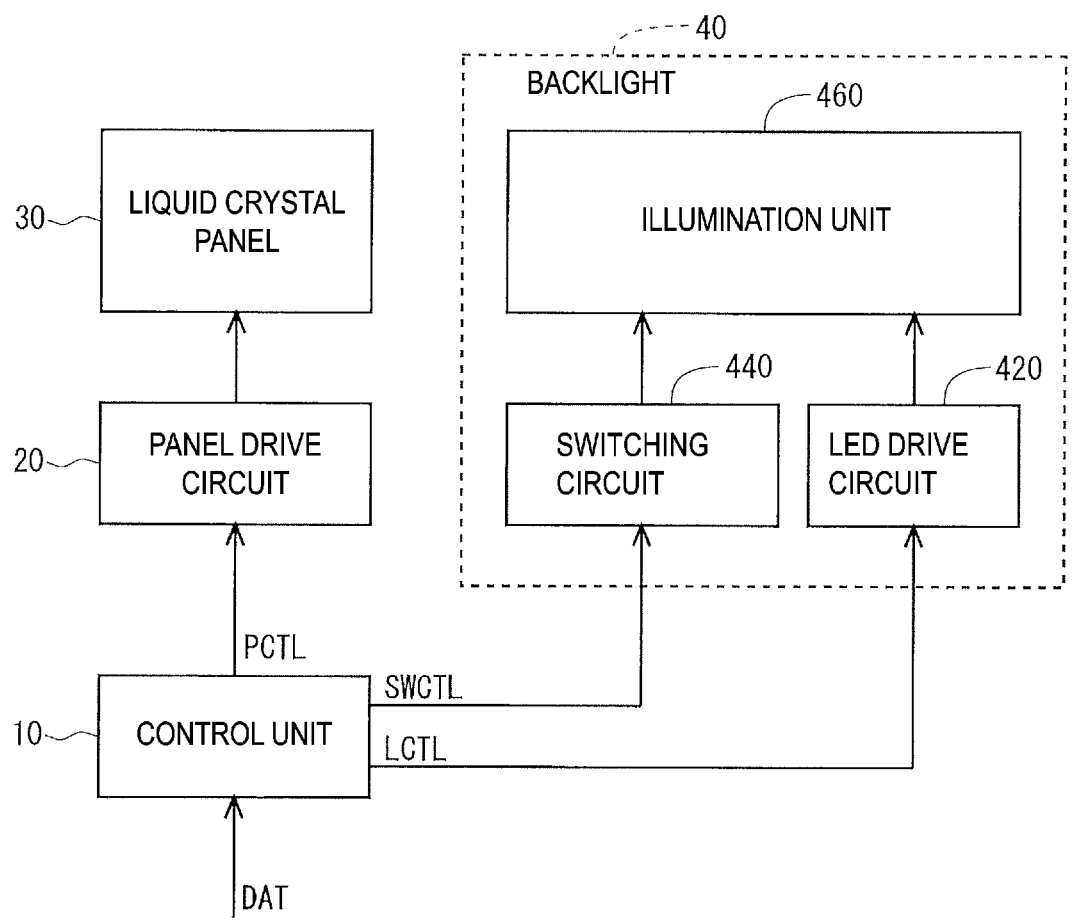
FIG. 2 is a block diagram illustrating an overall configuration of a liquid crystal display device according to the first embodiment.

FIG. 2 is a block diagram illustrating an overall configuration of a liquid crystal display device according to the first embodiment. This liquid crystal display device includes a control unit 10, a panel drive circuit 20, a liquid crystal panel 30, and a backlight 40 that uses LEDs as a light source. The liquid crystal panel 30 is formed with two opposing glass substrates, and includes a display portion that displays an image. The backlight 40 is provided on the back surface of the liquid crystal panel 30. The backlight 40 includes a LED drive circuit 420, a switching circuit 440, and an illumination unit 460. The illumination unit 460 includes a plurality of LED units provided on a substrate (LED substrate). In this regard, the LED substrate is logically divided into a plurality of areas, and the plurality of areas correspond to the plurality of LED units on a one-to-one basis.

Figure 3:
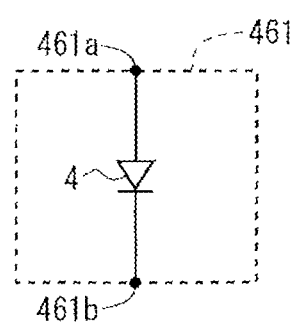
FIG. 3 is a diagram for describing a configuration of an LED unit regarding the first embodiment.
Figure 4:
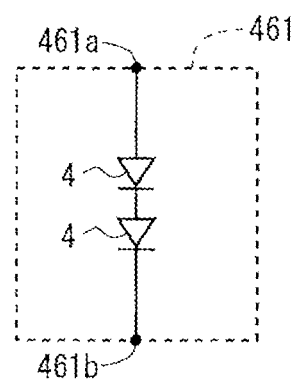
FIG. 4 is a diagram for describing a configuration of the LED unit regarding the first embodiment.
Figure 5:
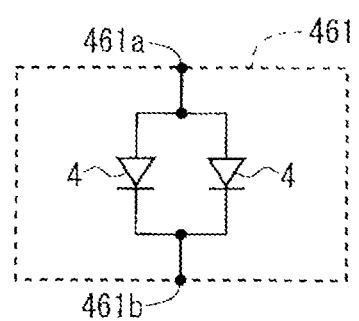
FIG. 5 is a diagram for describing a configuration of the LED unit regarding the first embodiment.
Figure 6:
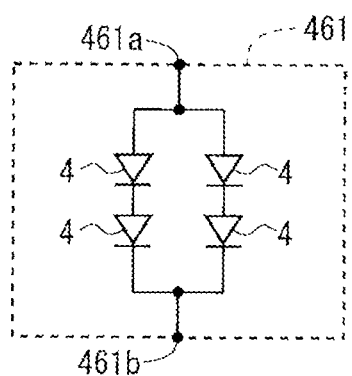
FIG. 6 is a diagram for describing a configuration of the LED unit regarding the first embodiment.

Note that, in the present embodiment, each of the LED units includes one LED. In other words, one LED is mounted on the LED substrate for each area. However, a configuration may be employed in which each of the LED units includes a plurality of the LEDs (specifically, a configuration in which a plurality of the LEDs are mounted on the LED substrate for each area). With the configuration described above, when the LED unit is denoted by a reference sign 461 and the LED is denoted by a reference sign 4, for example, the LED unit 461 may be constituted by one of the LEDs 4 as illustrated in FIG. 3, the LED unit 461 may be constituted by a plurality of the LEDs 4 connected to each other in series as illustrated in FIG. 4, the LED unit 461 may be constituted by a plurality of the LEDs 4 connected to each other in parallel as illustrated in FIG. 5, or the LEDs 4 connected to each other in series and the LEDs 4 connected to each other in parallel may be provided in combination in the LED unit 461 as illustrated in FIG. 6. Note that the anode of the LED 4 located furthest upstream in a path through which the current flows in the LED unit 461 is referred to as an "upstream end of an LED unit", and the cathode of the LED 4 located furthest downstream in the path through which the current flows in the LED unit 461 is referred to as a "downstream end of the LED unit". A portion denoted by a reference sign 461a in FIGS. 3 to 6 corresponds to the upstream end of the LED unit, and a portion denoted by a reference sign 461b in FIGS. 3 to 6 corresponds to the downstream end of the LED unit.

Figure 7:
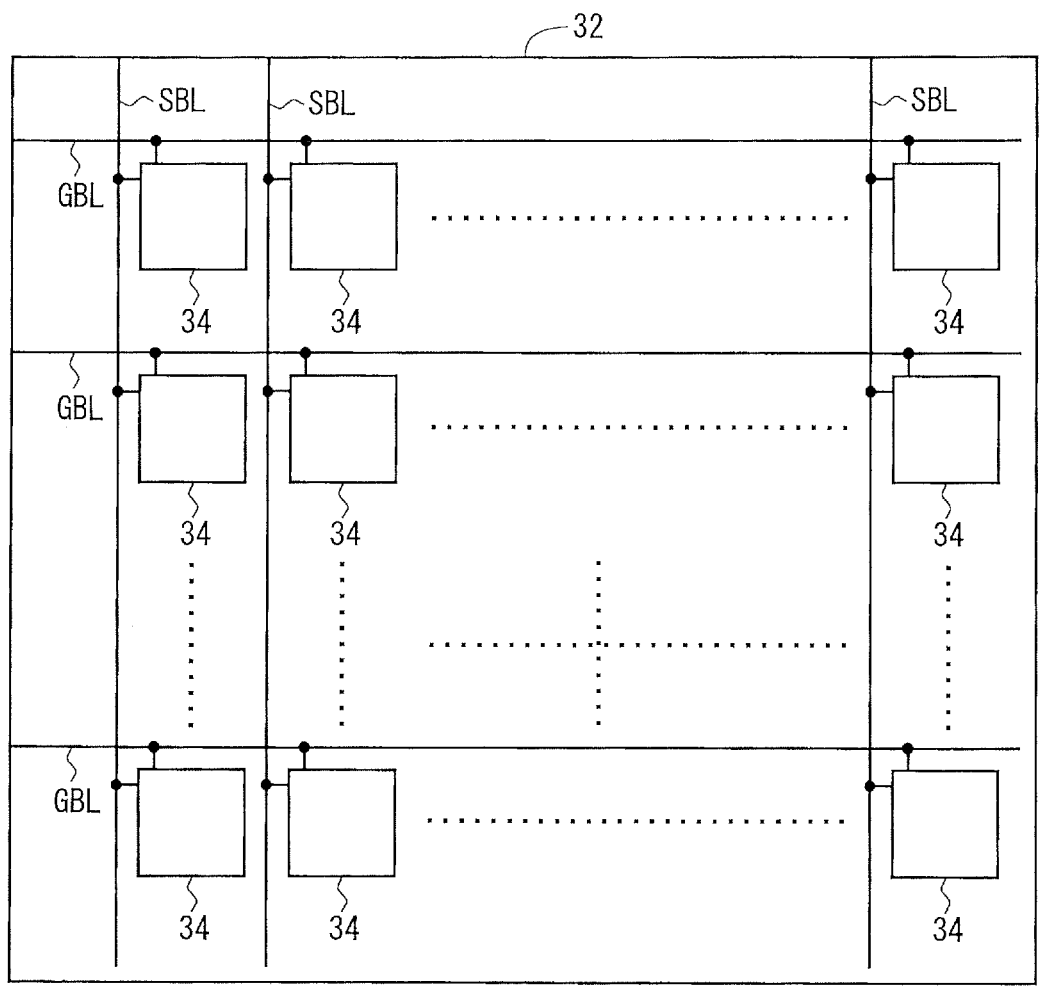
FIG. 7 is a diagram for describing a configuration of a display portion regarding the first embodiment.

As illustrated in FIG. 7, a plurality of gate bus lines GBL and a plurality of source bus lines SBL are disposed in a display portion 32 in the liquid crystal panel 30. A pixel unit 34 is provided so as to correspond to each of the intersections between the plurality of gate bus lines GBL and the plurality of source bus lines SBL. In other words, the display portion 32 includes a plurality of the pixel units 34. The plurality of pixel units 34 are arranged in a matrix shape to form a pixel matrix.

Figure 8:
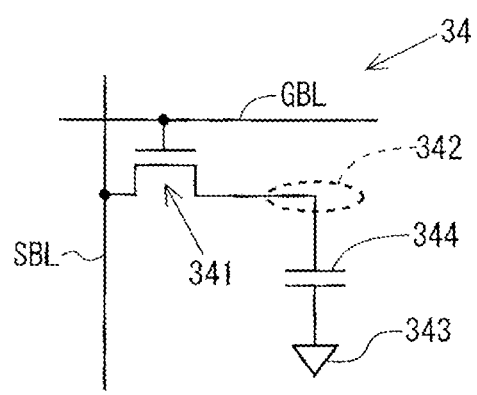
FIG. 8 is a circuit diagram illustrating a configuration of one pixel unit in the first embodiment.

FIG. 8 is a circuit diagram illustrating a configuration of one of the pixel units 34. Each of the pixel units 34 includes a pixel transistor 341, serving as a switching element, with a gate terminal connected to the gate bus line GBL passing through the corresponding intersection and with a source terminal connected to the source bus line SBL passing through the above corresponding intersection, a pixel electrode 342 connected to a drain terminal of the pixel transistor 341, a common electrode 343 to which a constant voltage is applied, and a liquid crystal capacitance 344 formed by the pixel electrode 342 and the common electrode 343. An auxiliary capacity may be provided in parallel with the liquid crystal capacitance 344 in some cases.

Operations of the constituent elements illustrated in FIG. 2 will be described. The control unit 10 receives image data DAT sent from the outside, and outputs a panel control signal PCTL for controlling an operation of the panel drive circuit 20, a luminance control signal LCTL for controlling an operation of the LED drive circuit 420, and a switching control signal SWCTL for controlling an operation of the switching circuit 440 so that the above-described local dimming (processing for controlling the luminance of the LED for each area) is performed. Note that each of the panel control signal PCTL, the luminance control signal LCTL, and the switching control signal SWCTL is constituted by a plurality of control signals.

The panel drive circuit 20 drives the liquid crystal panel 30 based on the panel control signal PCTL sent from the control unit 10. Specifically, the panel drive circuit 20 includes a gate driver that drives the gate bus lines GBL, and a source driver that drives the source bus lines SBL. As a result of the gate driver driving the gate bus lines GBL and the source driver driving the source bus lines SBL, a voltage corresponding to a target display image is written to the liquid crystal capacitance 344 in each of the pixel units 34.

The LED drive circuit 420 controls the luminance of each of the LEDs in the illumination unit 460 (controls the current supplied to each of the LEDs) based on the luminance control signal LCTL sent from the control unit 10. Based on the switching control signal SWCTL sent from the control unit 10, using time division, the switching circuit 440 switches the supply destination of a power supply voltage for driving the LEDs between a plurality of blocks, during one lighting period. In other words, based on the switching control signal SWCTL sent from the control unit 10, using the time division, the switching circuit 440 switches the supply destination of the power supply voltage for driving the LEDs between a plurality of anode lines, during the one lighting period. When four blocks are provided as in an example to be described later, using the time division, the switching circuit 440 switches the supply destination of the power supply voltage for driving the LEDs between the four blocks (four anode lines), during the one lighting period. The switching circuit 440 also has a function of controlling a flow of a charge so as to suppress the occurrence of the above-described second type abnormal lighting.

As described above, one LED is provided for each area in the illumination unit 460, and each of the LEDs emits light at a desired luminance under the control of the LED drive circuit 420 and the switching circuit 440. As a result, the illumination unit 460 illuminates the display portion 32 with light from the back surface thereof.

As described above, in a state in which the voltage corresponding to the target display image is written to the liquid crystal capacitance 344 in each of the pixel units 34 provided in the display portion 32 of the liquid crystal panel 30, the illumination unit 460 in the backlight 40 illuminates the display portion 32 with light from the back surface thereof. As a result, a desired image is displayed on the display portion 32.

1.2 Backlight

1.2.1 Configuration

Figure 1:
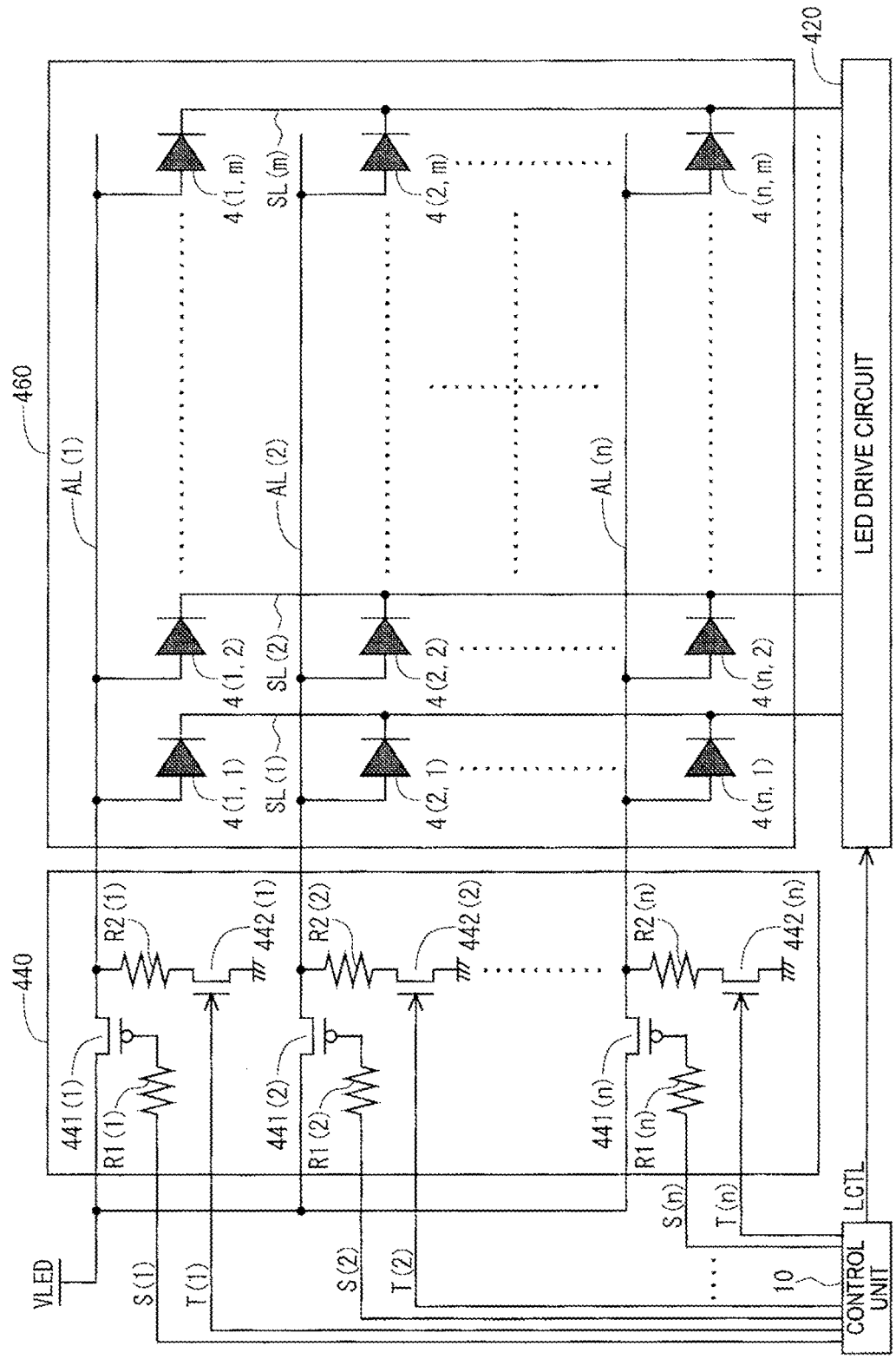
FIG. 1 is a block diagram for describing a configuration of a backlight in a first embodiment.
Figure 27:
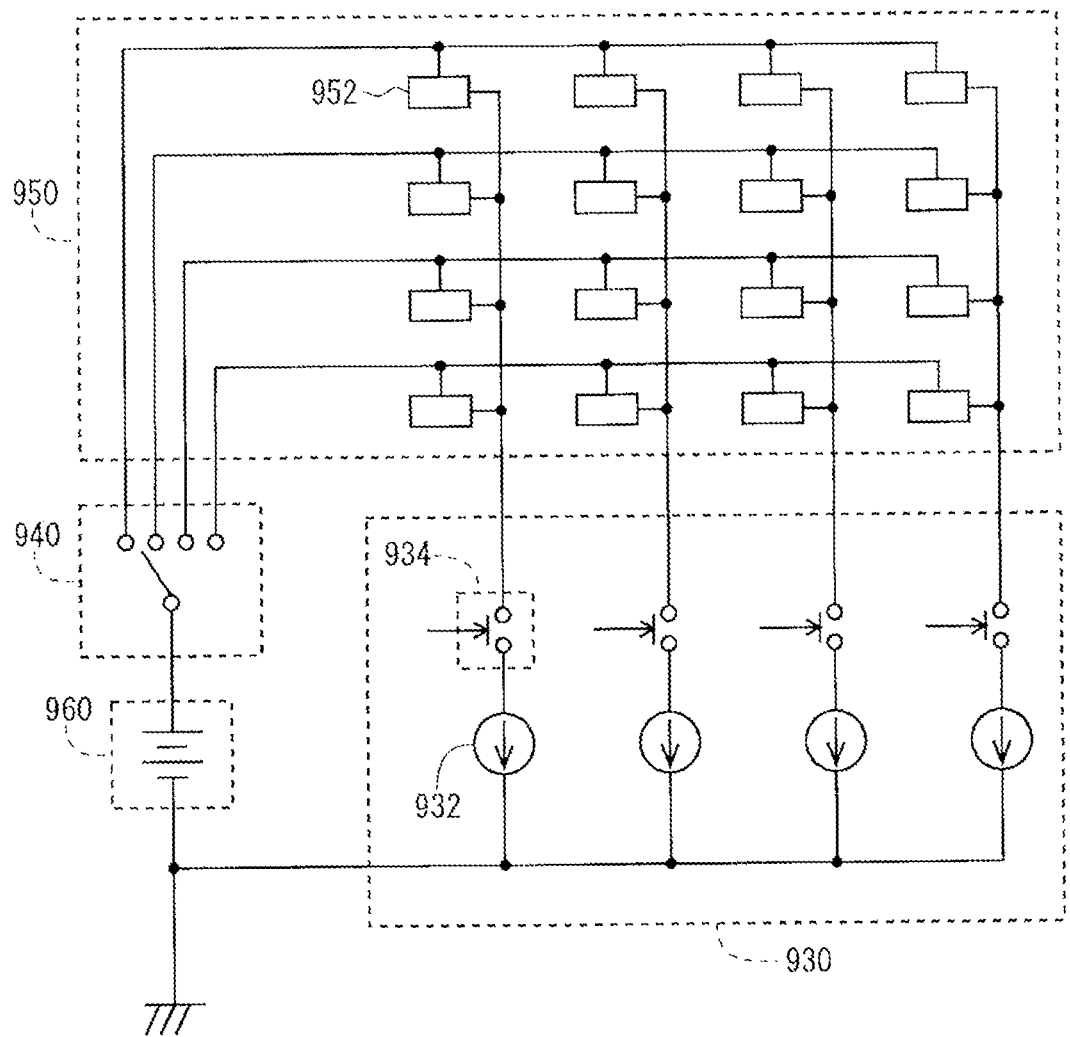
FIG. 27 is a schematic circuit diagram illustrating a configuration example of a backlight that performs passive driving, regarding a known example.
Figure 28:
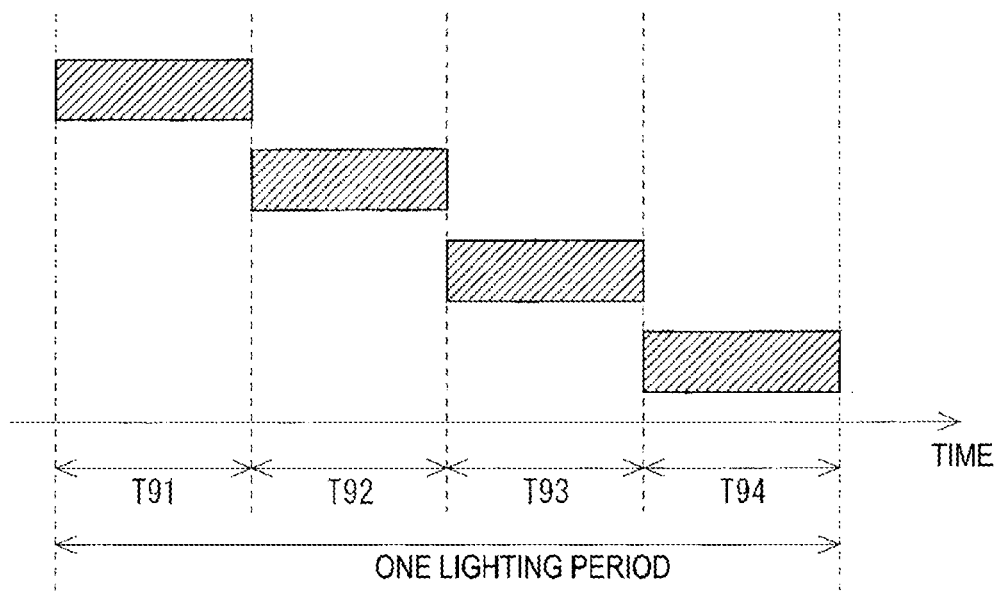
FIG. 28 is a diagram for describing one lighting period when the passive driving is performed, regarding the known example.
Figure 29:
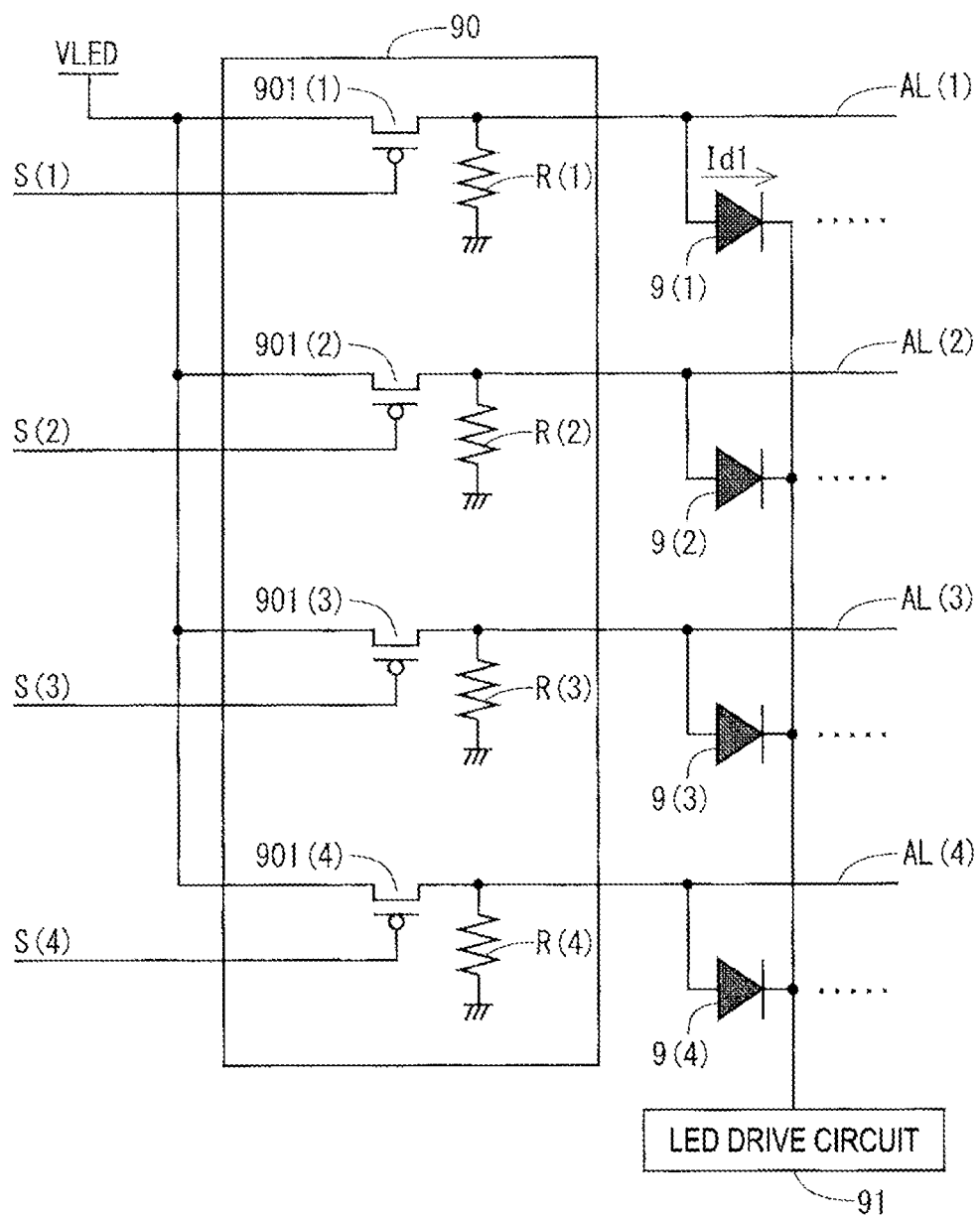
FIG. 29 is a circuit diagram illustrating a configuration example of a portion constituted by a switching circuit and LEDs of one column, regarding a known example.
Figure 30:
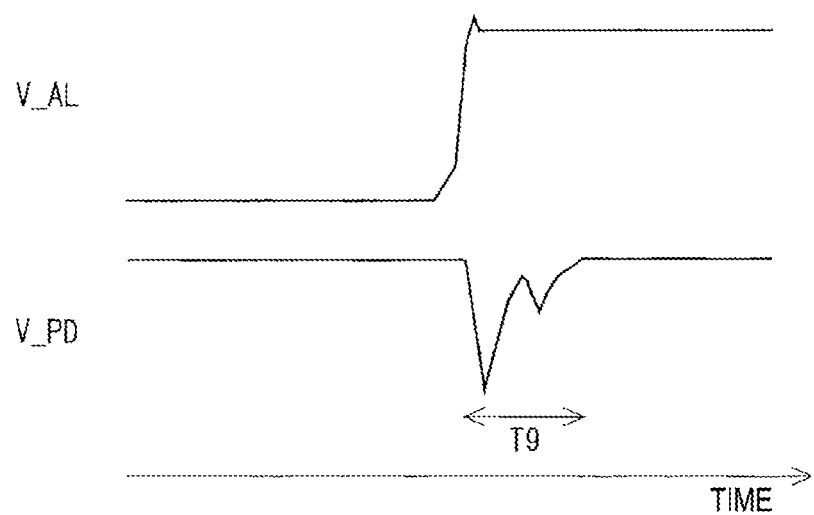
FIG. 30 is a waveform diagram for describing unnecessary lighting of the LED at a time of rising of the anode voltage, regarding the known example.
Figure 31:
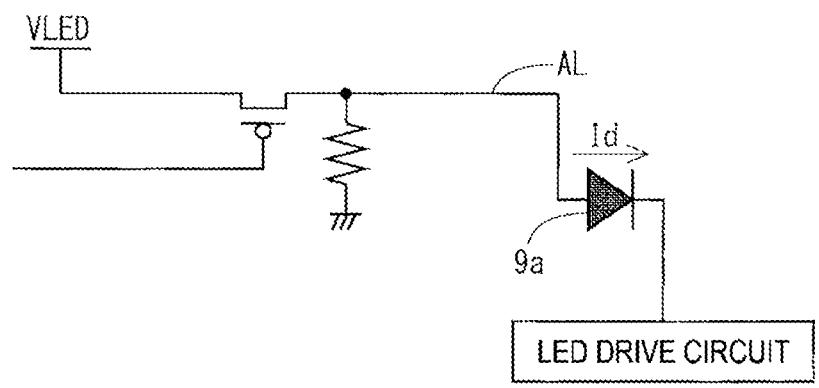
FIG. 31 is a circuit diagram illustrating a configuration for driving the LED in a case in which the passive driving is not employed, regarding the known example.
Figure 32:
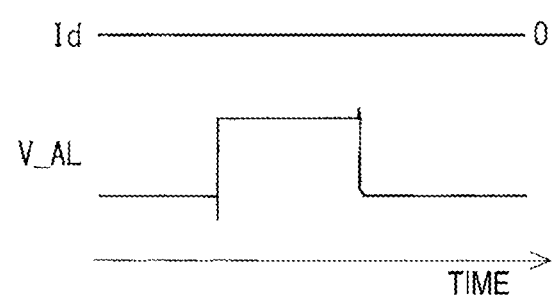
FIG. 32 is a waveform diagram for describing an operation in the case in which the passive driving is not employed, regarding the known example.
Figure 33:
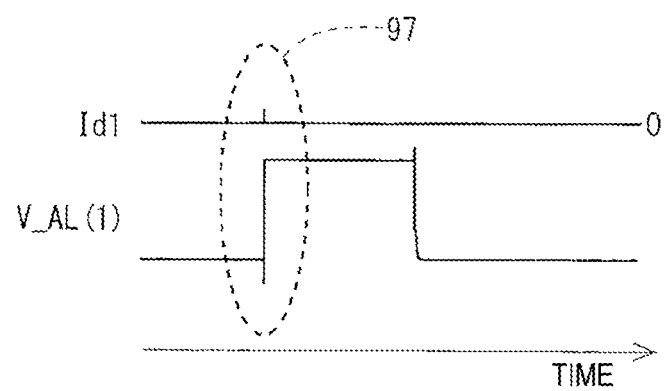
FIG. 33 is a waveform diagram for describing an operation in a case in which the passive driving is employed, regarding the known example.
Figure 34:
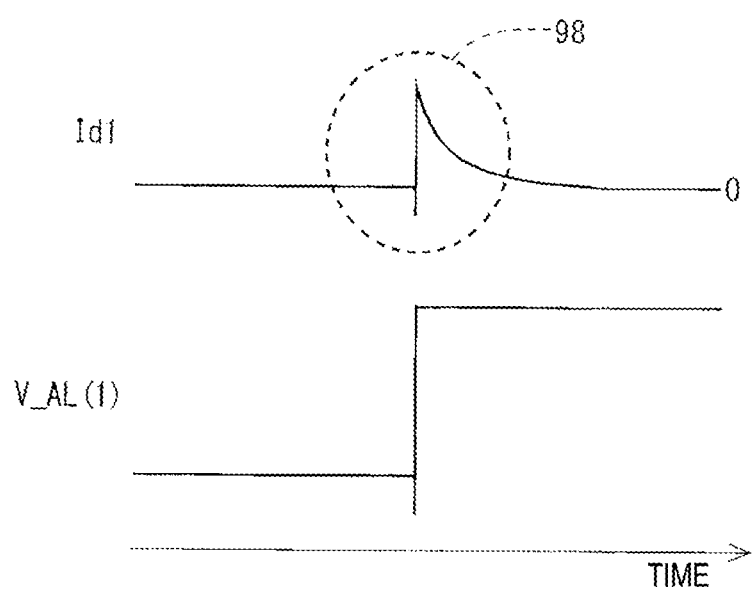
FIG. 34 is an enlarged view of a portion denoted by a reference sign 97 in FIG. 33.
Figure 35:
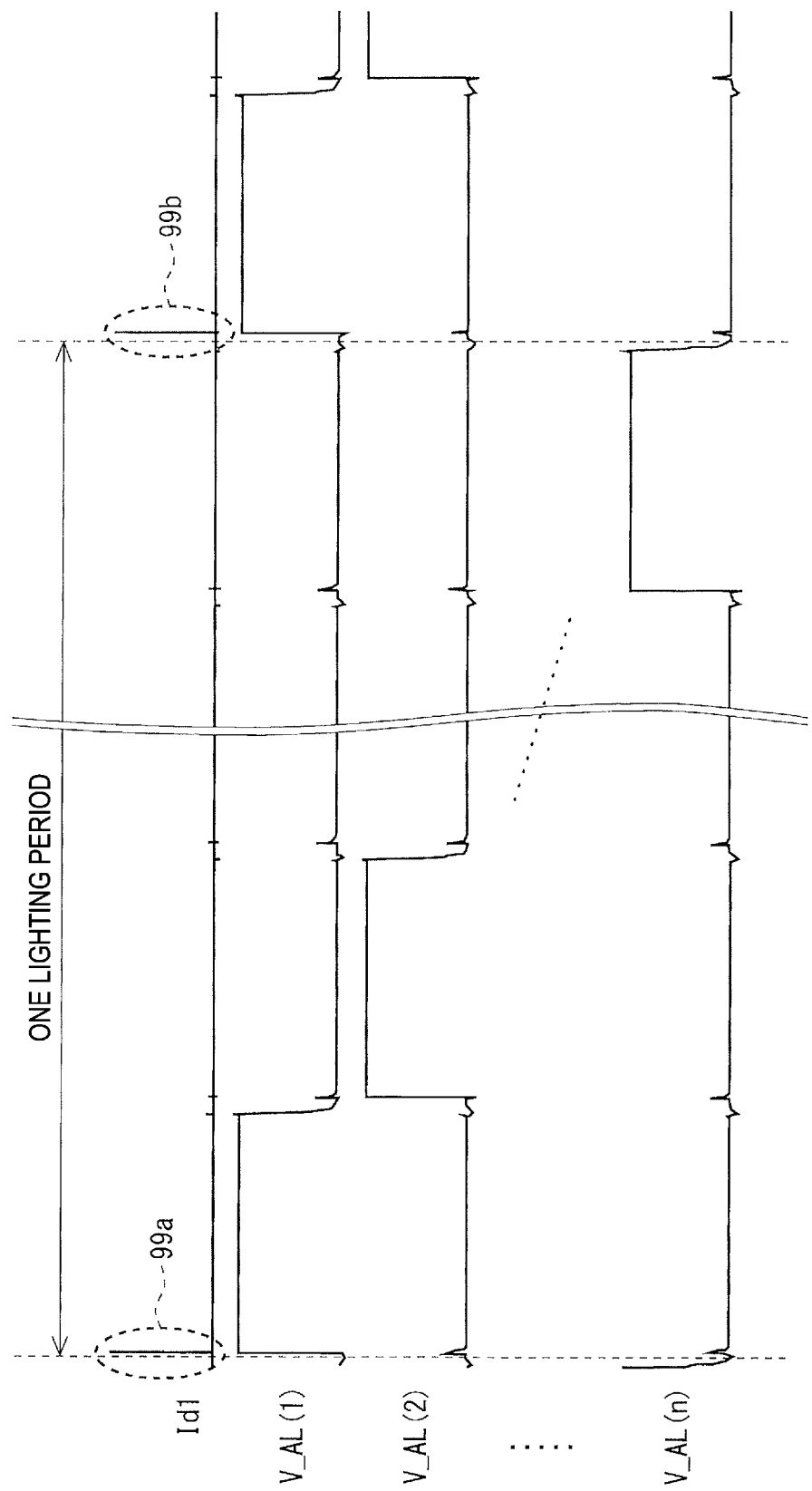
FIG. 35 is a waveform diagram in a case in which the LEDs of the first row are the LEDs to be turned off, regarding the known example.
Figure 36:
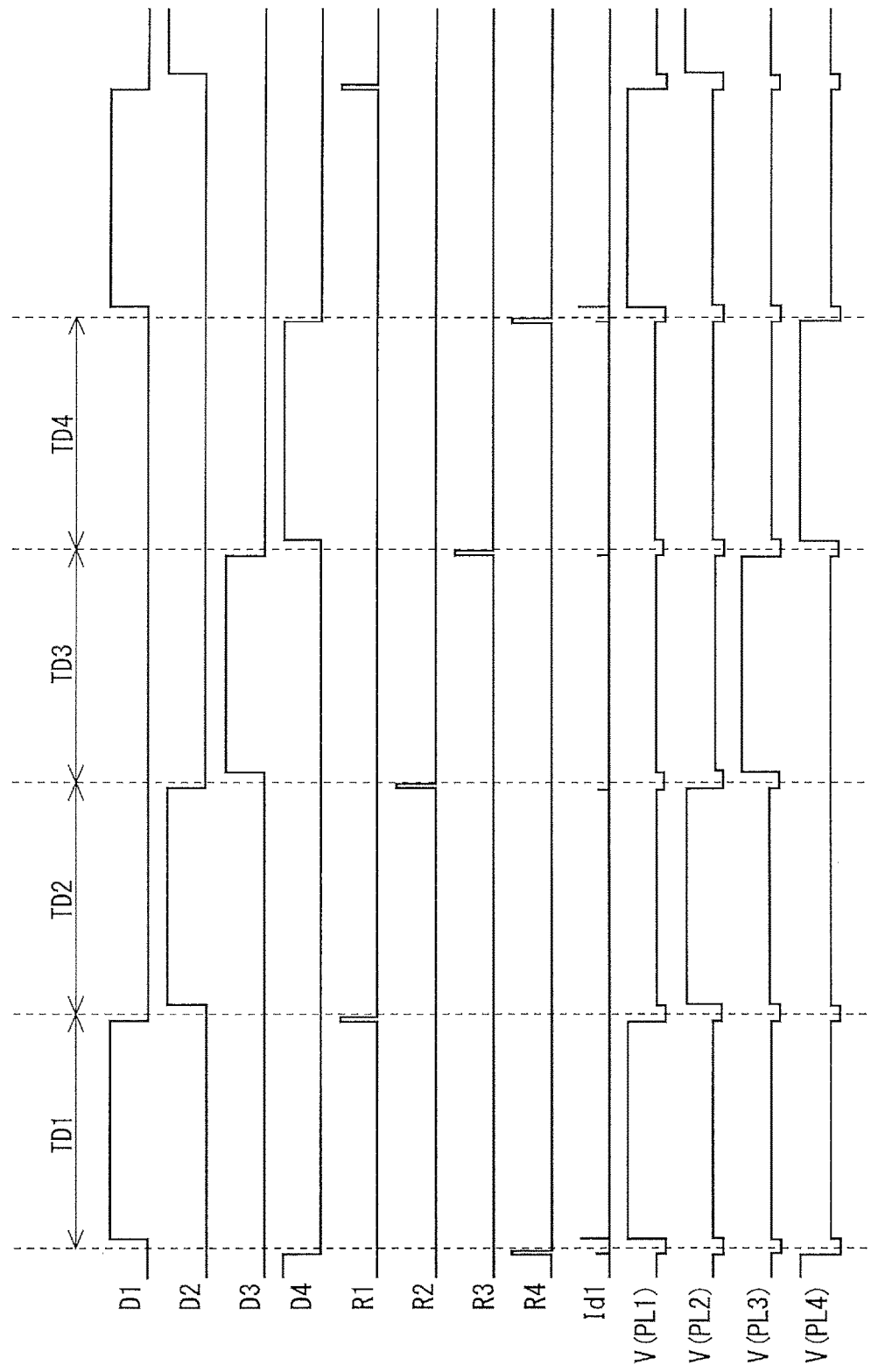
FIG. 36 is a waveform diagram for describing the fact that the LEDs to be turned off may be faintly turned on when the technique disclosed in US 2020/0257167 is used.

FIG. 1 is a block diagram for describing a configuration of the backlight 40. As described above, the backlight 40 includes the LED drive circuit 420, the switching circuit 440, and the illumination unit 460. Note that, since a known configuration (see FIG. 27, for example) is employed for the LED drive circuit 420, detailed description thereof will be omitted.

The illumination unit 460 is provided with (n×m) LEDs 4(1, 1) to 4(n, m). In other words, the LED substrate constituting the illumination unit 460 is logically divided into (n×m) areas. Note that, in FIG. 1, the LED of the i-th row and the j-th column is denoted by a reference sign 4(i, j) (i is an integer of 1 to n, and j is an integer of 1 to m). Further, n anode lines AL(1) to AL(n) extending in the horizontal direction in FIG. 1, and m lighting control lines SL(1) to SL(m) extending in the vertical direction in FIG. 1 are disposed in the illumination unit 460. The n anode lines AL(1) to AL(n) are connected to the switching circuit 440, and the m lighting control lines SL(1) to SL(m) are connected to the LED drive circuit 420. Each of the intersections between the n anode lines AL(1) to AL(n) and the m lighting control lines SL(1) to SL(m) corresponds to one area, and one of the LEDs 4 is provided for each area. With respect to each of the LEDs 4, the anode is connected to the corresponding anode line AL, and the cathode is connected to the corresponding lighting control line SL. Note that, when the LED unit including the plurality of LEDs is provided in each area, the upstream end of each of the LED units is connected to the corresponding anode line AL, and the downstream end of each of the LED units is connected to the corresponding lighting control line SL.

Incidentally, in this backlight 40, the above-described passive driving (time division driving) is performed. In this regard, in the present embodiment, it is assumed that one block is configured by the LEDs 4 of one row (in other words, the LEDs 4 in the illumination unit 460 are divided up into n blocks). However, the configuration is not limited thereto, and for example, one block may be configured by the LEDs 4 of a plurality of rows. Each of the anode lines AL is connected to the anode of the LED 4 included in the corresponding block.

Figure 9:
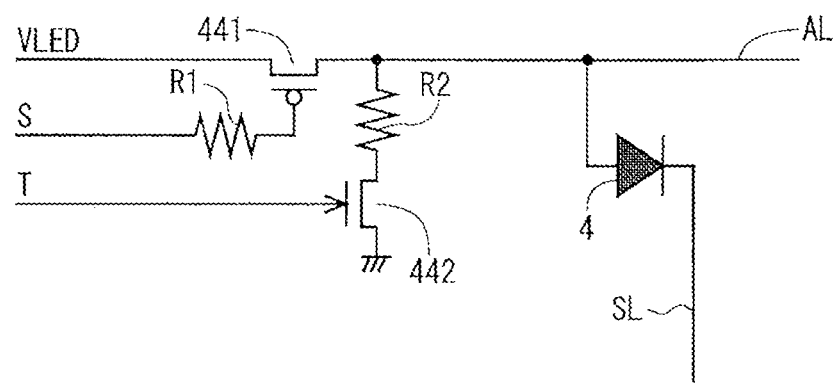
FIG. 9 is a circuit diagram illustrating a configuration of an anode line control circuit in the first embodiment.

The switching circuit 440 includes n first switching elements 441(1) to 441(n), n second switching elements 442(1) to 442(n), n first resistors R1(1) to R1(n), and n second resistors R2(1) to R2(n). In other words, one of the first switching elements 441, one of the second switching elements 442, one of the first resistors R1, and one of the second resistors R2 are provided for each of the anode lines AL. Hereinafter, attention is paid to the constituent elements corresponding to one of the anode lines AL (see FIG. 9). Note that, in the present specification, a circuit including the constituent elements corresponding to one of the anode lines AL is referred to as an "anode line control circuit". Thus, the switching circuit 440 includes n anode line control circuits.

The first switching element 441 and the second switching element 442 function as switches. In the present embodiment, the first switching element 441 is a p-channel FET, and the second switching element 442 is an n-channel FET. However, the types of the first switching element 441 and the second switching element 442 are not limited to this example.

One end of the first resistor R1 is connected to a control terminal of the first switching element 441, and the other end thereof is connected to the control unit 10. One end of the second resistor R2 is connected to the anode line AL, and the other end thereof is connected to a first conduction terminal of the second switching element 442. With respect to the first switching element 441, the control terminal thereof is connected to the one end of the first resistor R1, a power supply voltage (power supply voltage for driving the LEDs) VLED is applied to a first conduction terminal thereof, and a second conduction terminal thereof is connected to the anode line AL. With respect to the second switching element 442, a control terminal thereof is connected to the control unit 10, the first conduction terminal thereof is connected to the other end of the second resistor R2, and a second conduction terminal thereof is grounded. Note that the second conduction terminal of the second switching element 442 need not necessarily be grounded, and it is sufficient that a predetermined potential be applied to the second conduction terminal of the second switching element 442.

The resistance value of the first resistor R1 is from 100 Ω to 10 kΩ. In this regard, the greater the resistance value of the first resistor R1, the smaller the magnitude of the unnecessary current. However, responsiveness deteriorates at a time of rising of the voltage of the anode line AL (dullness of the voltage waveform is increased). Thus, it is preferable to appropriately determine the resistance value of the first resistor R1 using an actual circuit. The resistance value of the second resistor R2 is from 1 Ω to 10 kΩ.

Incidentally, as the above-described switching control signal SWCTL, the first control signals S(1) to S(n) and the second control signals T(1) to T(n) are applied to the switching circuit 440 from the control unit 10. The first control signal S is applied to the other end of the first resistor R1. In other words, the first control signal S is applied to the control terminal of the first switching element 441 via the first resistor R1. Therefore, the first switching element 441 is switched between the ON state and the OFF state based on the first control signal S. The second control signal T is applied to the control terminal of the second switching element 442. Therefore, the second switching element 442 is switched between the ON state and the OFF state based on the second control signal T.

Note that, in the present embodiment, a plurality of power supply lines are realized by the n anode lines AL(1) to AL(n), and a plurality of power supply line control circuits are realized by the n anode line control circuits.

1.2.2 Method for Controlling Lighting of LEDs

Figure 10:
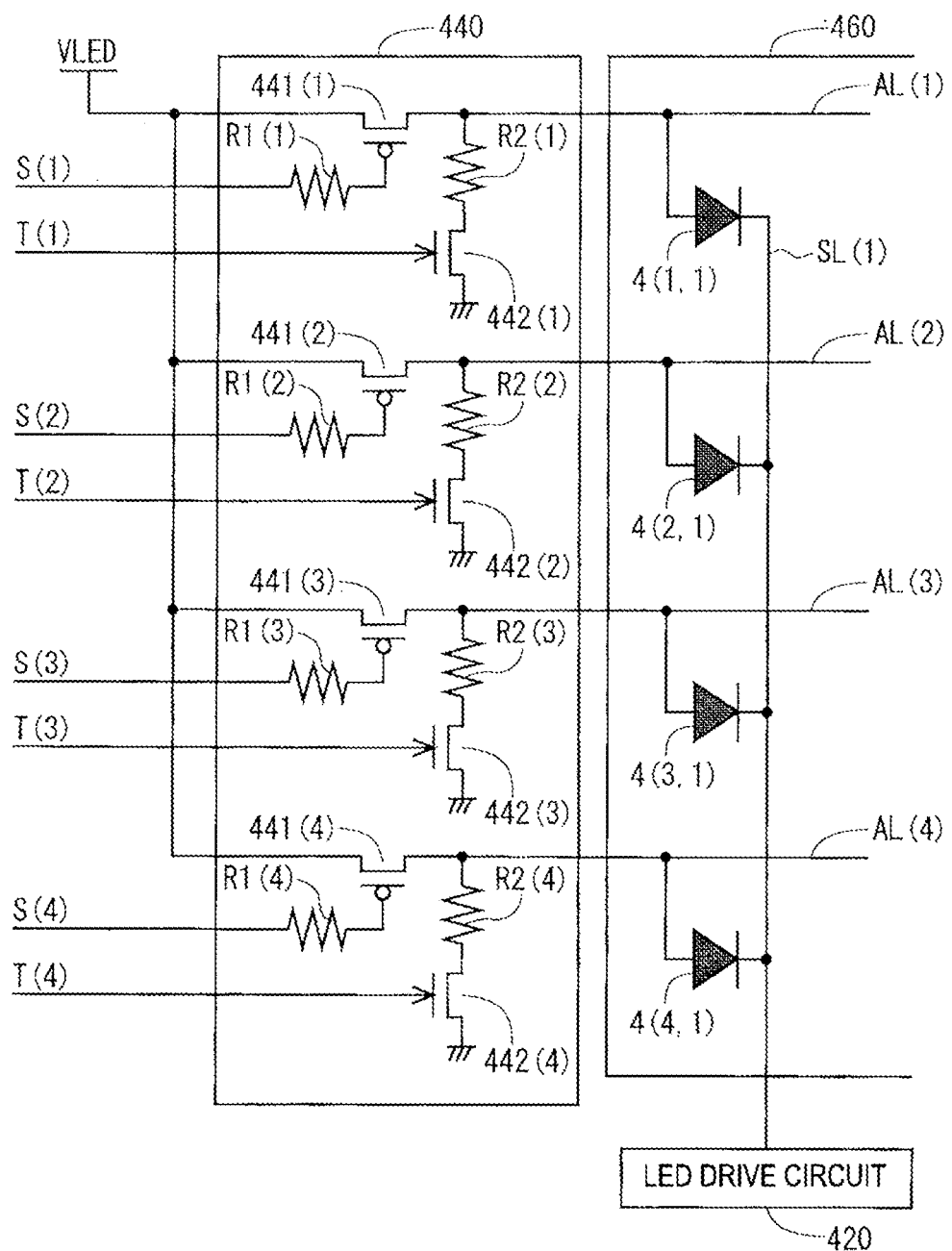
FIG. 10 is a circuit diagram illustrating a configuration of a portion constituted by the first column in an illumination unit and a switching circuit in the first embodiment.

Next, a method for controlling lighting of the LEDs 4 in the illumination unit 460 will be described. Here, a case in which n is 4 will be described as an example. Specifically, as for the case to which attention is paid here, a configuration of a portion constituted by the first column in the illumination unit 460 and the switching circuit 440 is as illustrated in FIG. 10.

Figure 11:
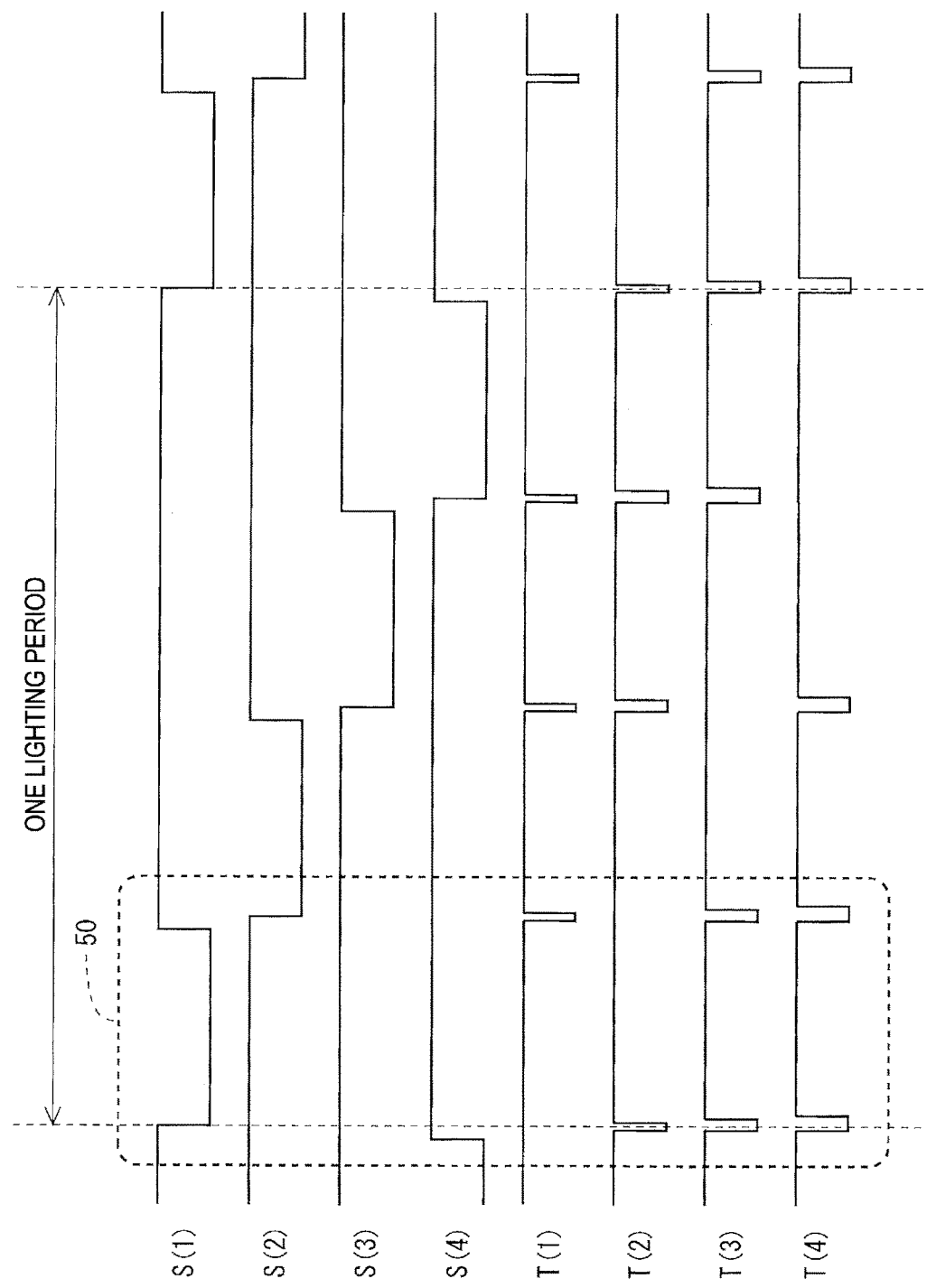
FIG. 11 is a waveform diagram of switching control signals (a first control signal and a second control signal) in the first embodiment.

FIG. 11 is a waveform diagram of the switching control signals SWCTL (the first control signals S and the second control signals T) in the present embodiment. As illustrated in FIG. 11, in the one lighting period, the first control signal S(1), the first control signal S(2), the first control signal S(3), and the first control signal S(4) are sequentially set to a low level for a predetermined period at a time. In each of the anode line control circuits (see FIG. 9), the first switching element 441 is in the OFF state when the first control signal S is at a high level, and the first switching element 441 is in the ON state when the first control signal S is at the low level. Thus, when the first control signal S is at the low level, the power supply voltage VLED is applied to the anode line AL. Thus, as described above, as a result of the first control signal S(1), the first control signal S(2), the first control signal S(3), and the first control signal S(4) being sequentially set to the low level for the predetermined period at a time, the LEDs of the first row, the LEDs of the second row, the LEDs of the third row, and the LEDs of the fourth row are sequentially set to a lighting-enabled state for the predetermined period at a time.

Figure 12:
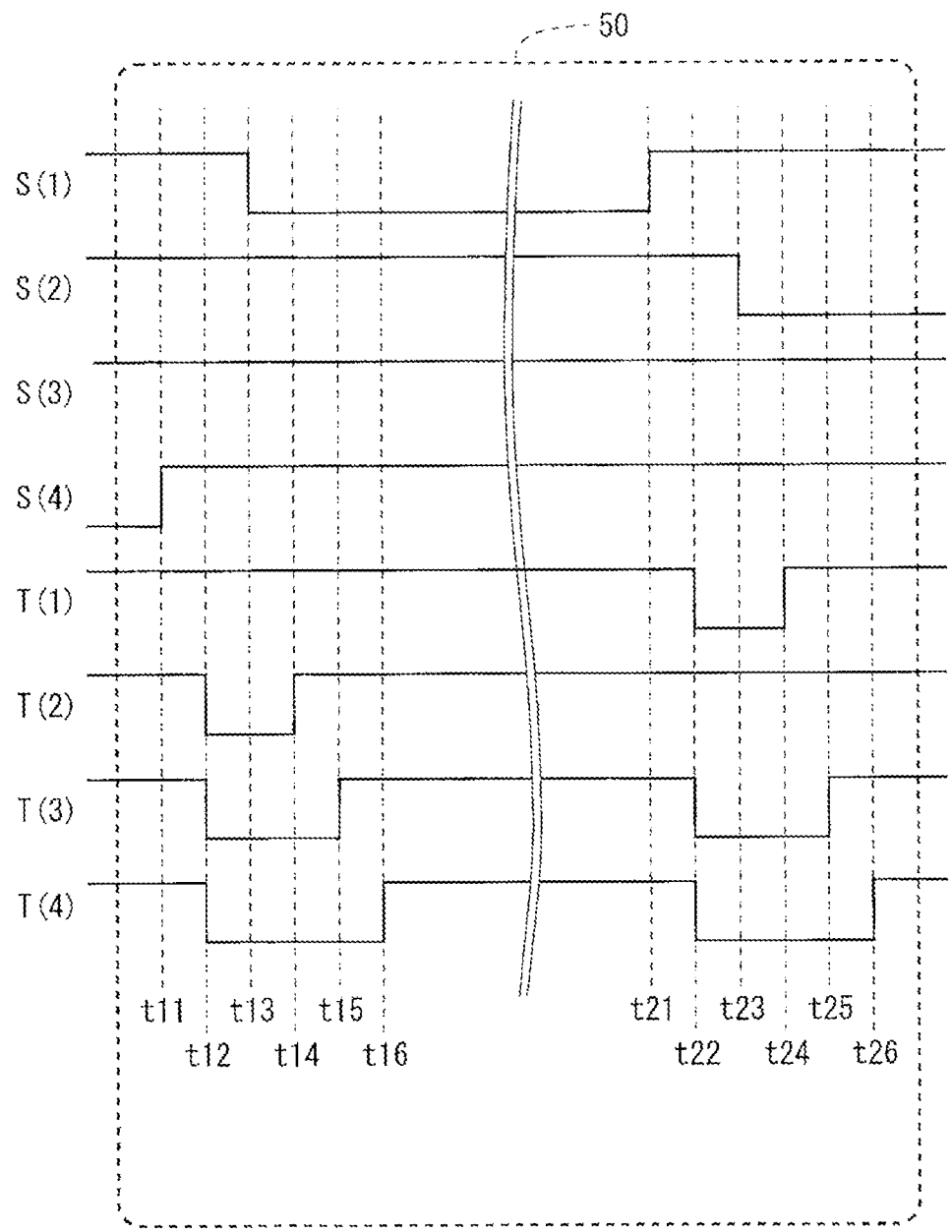
FIG. 12 is a detailed waveform diagram of a portion indicated by a reference sign 50 in FIG. 11.

FIG. 12 is a detailed waveform diagram of a portion indicated by a reference sign 50 in FIG. 11. In a period immediately before a time t11, the first control signal S(4) is at the low level. Therefore, the first switching element 441(4) is in the ON state, and thus the LEDs of the fourth row are in the lighting-enabled state. At the time t11, the first control signal S(4) changes from the low level to the high level. As a result, the first switching element 441(4) is turned off. At this time, the second control signal T(4) is at the high level, and thus the second switching element 442(4) is in the ON state. As a result, the voltage of the anode line AL(4) decreases, and the LEDs of the fourth row are set to a lighting-disabled state.

At a time t12, the second control signal T(2), the second control signal T(3), and the second control signal T(4) change from the high level to the low level. As a result, the second switching element 442(2), the second switching element 442(3), and the second switching element 442(4) are turned off.

At a time t13, the first control signal S(1) changes from the high level to the low level. As a result, the first switching element 441(1) is turned on, and the LEDs of the first row is set to the lighting-enabled state.

At a time t14, the second control signal T(2) changes from the low level to the high level. As a result, the second switching element 442(2) is turned on. At a time t15, the second control signal T(3) changes from the low level to the high level. As a result, the second switching element 442(3) is turned on. At a time t16, the second control signal T(4) changes from the low level to the high level. As a result, the second switching element 442(4) is turned on. Note that, in this example, the second switching element 442(2), the second switching element 442(3), and the second switching element 442(4) change from the OFF state to the ON state in this order, but the order in which the second switching elements 442 change from the OFF state to the ON state is not limited to this example.

Thereafter, at a time t21, the first control signal S(1) changes from the low level to the high level. As a result, the first switching element 441(1) is turned off. At this time, the second control signal T(1) is at the high level, and thus the second switching element 442(1) is in the ON state. As a result, the voltage of the anode line AL(1) decreases, and the LEDs of the first row are set to the lighting-disabled state.

At a time t22, the second control signal T(1), the second control signal T(3), and the second control signal T(4) change from the high level to the low level. As a result, the second switching element 442(1), the second switching element 442(3), and the second switching element 442(4) are turned off.

At a time t23, the first control signal S(2) changes from the high level to the low level. As a result, the first switching element 441(2) is turned on, and the LEDs of the second row are set to the lighting-enabled state.

At a time t24, the second control signal T(1) changes from the low level to the high level. As a result, the second switching element 442(1) is turned on. At a time t25, the second control signal T(3) changes from the low level to the high level. As a result, the second switching element 442(3) is turned on. At a time t26, the second control signal T(4) changes from the low level to the high level. As a result, the second switching element 442(4) is turned on. Note that, in this example, the second switching element 442(1), the second switching element 442(3), and the second switching element 442(4) change from the OFF state to the ON state in this order, but the order in which the second switching elements 442 change from the OFF state to the ON state is not limited to this example.

Based on the description above, when, of two of the anode lines AL to which the power supply voltage VLED is continuously supplied, the anode line AL to which the power supply voltage VLED is supplied first is defined as a "first anode line of interest", and, of the two of the anode lines AL, the anode line AL to which the power supply voltage VLED is supplied subsequently is defined as a "second anode line of interest", the following operation is performed when the supply destination of the power supply voltage VLED is switched from the first anode line of interest to the second anode line of interest (when blocks to be driven are switched).

During a period from a time at which the first switching element 441 corresponding to the first anode line of interest has changed from the ON state to the OFF state based on the first control signal S, to a time at which the first switching element 441 corresponding to the second anode line of interest changes from the OFF state to the ON state based on the first control signal S, the plurality of second switching elements 442 respectively corresponding to the plurality of anode lines other than the second anode line of interest change from the ON state to the OFF state based on the second control signals T, and during a period after a time at which the time at which the first switching element 441 corresponding to the second anode line of interest has changed from the OFF state to the ON state based on the first control signal S, the plurality of second switching elements 442 respectively corresponding to the plurality of anode lines other than the second anode line of interest change from the OFF state to the ON state based on the second control signals T. Note that all the second switching elements 442 are in the ON state immediately before the time at which the first switching element 441 corresponding to the first anode line of interest changes from the ON state to the OFF state. As described above, when the voltage of the first anode line of interest decreases based on the first control signal S, not only the second switching element 442 corresponding to the first anode line of interest, but also the second switching elements 442 respectively corresponding to the anode lines other than the first anode line of interest are in the ON state. Thus, when the voltage of the first anode line of interest decreases, the current is inhibited from flowing through the LEDs 4 connected to the anode lines other than the first anode line of interest.

Further, slightly before the voltage of the second anode line of interest increases based on the first control signal S, all the second switching elements 442 corresponding to the anode lines other than the second anode line of interest change from the ON state to the OFF state. In other words, at the time at which the first switching element 441 corresponding to the second anode line of interest changes from the OFF state to the ON state based on the first control signal S, the plurality of second switching elements 442 respectively corresponding to the plurality of anode lines other than the second anode line of interest are maintained in the OFF state based on the second control signals T. Specifically, when the voltage of the second anode line of interest increases, the anode lines other than the second anode line of interest are electrically disconnected from the ground. Thus, when the LED 4 connected to the second anode line of interest is to be turned off, the current is inhibited from flowing through the LED 4 when the voltage of the second anode line of interest increases.

1.3 Effects

According to the present embodiment, the switching circuit 440 for switching the supply destination of the power supply voltage VLED between the n anode lines AL(1) to Al(n) is provided with the n second switching elements 442(1) to 442(n), which function as switches for controlling the electrical connection state between each of the anode lines AL and the ground. Then, when the first switching element 441 corresponding to the anode line AL to be driven changes from the OFF state to the ON state based on the first control signal S, the second switching elements 442 corresponding to the anode lines AL other than the anode line AL to be driven are maintained in the OFF state based on the second control signals T. Specifically, when the voltage of the anode line AL to be driven increases, the second switching elements 442 corresponding to the anode lines AL other than the anode line AL to be driven are in the OFF state, and the anode lines AL other than the anode line AL to be driven are electrically disconnected from the ground. Thus, when the LED connected to the anode line AL to be driven (LED to be driven) is to be turned off, the flow of the charge due to the increase in the voltage of the anode line AL to be driven is suppressed. Further, in the switching circuit 440, the one end of the first resistor R1 is connected to the control terminal of the first switching element 441, which controls the supply of the power supply voltage VLED to the anode line AL. As a result, when the LED to be driven is to be turned off, the accumulation of the charge in the parasitic capacitances of the first switching elements 441 connected to the anode lines AL other than the anode line AL to be driven slows down, and the flow of the charge due to the increase in the voltage of the anode line AL to be driven is suppressed.

Figure 13:
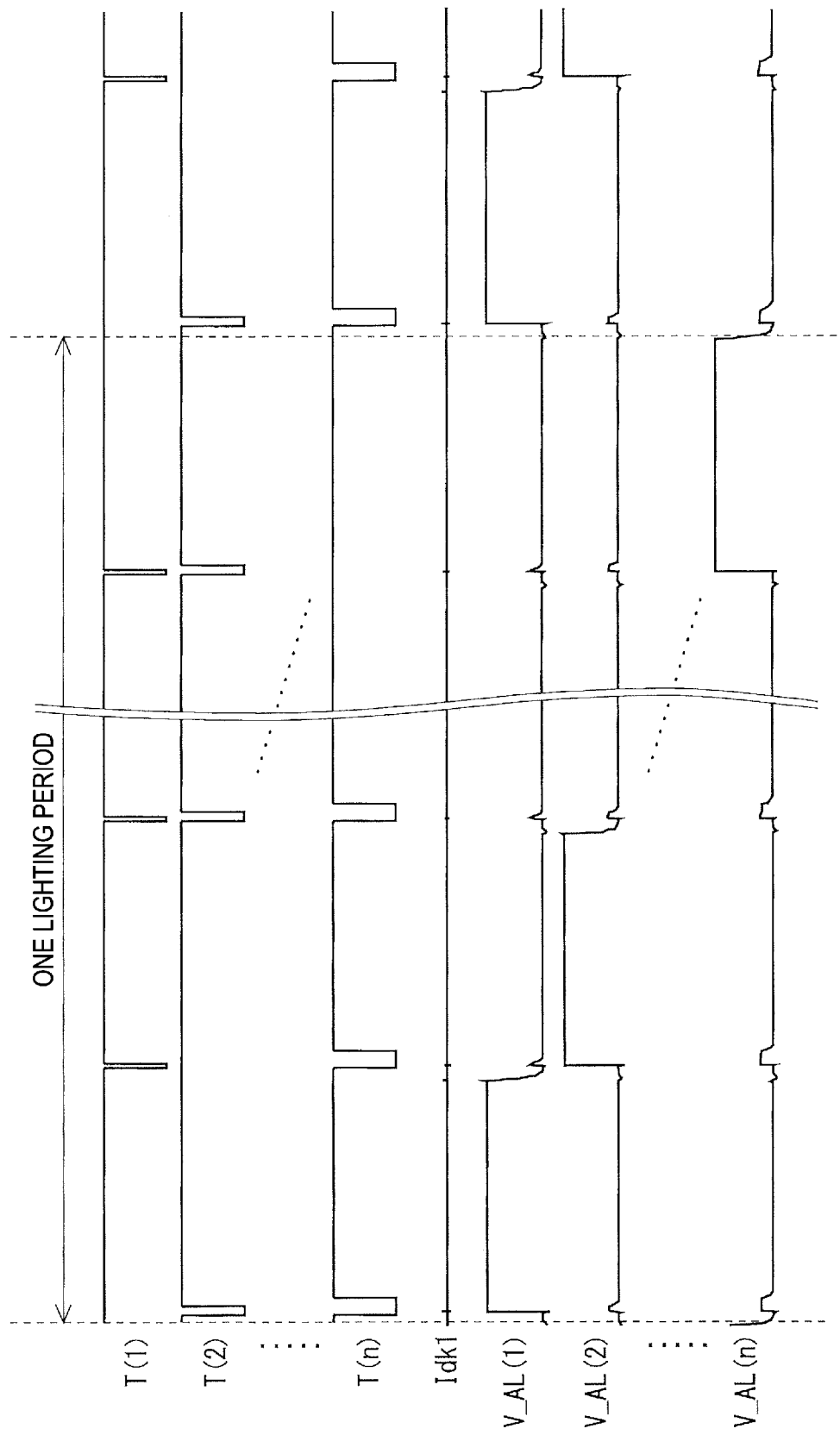
FIG. 13 is a waveform diagram for describing an effect of the first embodiment.

FIG. 13 illustrates waveforms of the second control signals T(1) to T(n), a current Idk1 flowing through the LEDs of the first row (LEDs to be turned off), and voltages V_AL(1) to V_AL(n) of the anode lines AL(1) to AL(n). In the one lighting period, the voltages V_AL(1) to V_AL(n) of the anode lines AL(1) to AL(n) are sequentially set to the high level for the predetermined period at a time. Here, when the voltage V_AL of each of the anode lines AL increases, and also when the voltage V_AL of each of the anode lines AL decreases, almost no current flows through the LEDs of the first row. Thus, the LEDs of the first row are maintained in a lighting-off state. The same applies to the LEDs other than those of the first row.

Figure 14:
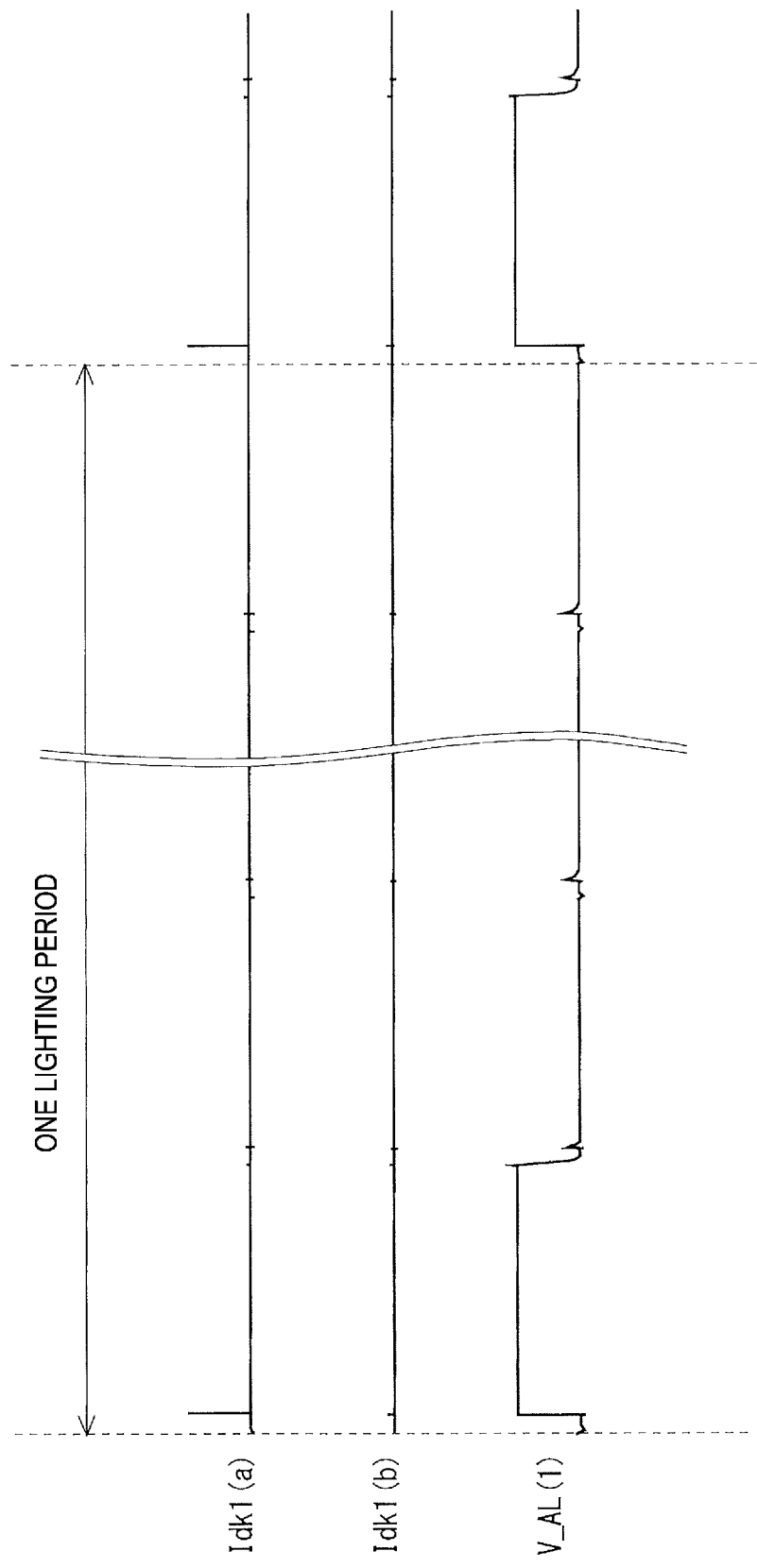
FIG. 14 is a waveform diagram for describing the effect of the first embodiment.

A difference in the current Idk1 between a known example and the present embodiment will be described with reference to FIG. 14. In FIG. 14, the current Idk1 in the known example is indicated by Idk1(a), and the current Idk1 in the present embodiment is indicated by Idk1(b). It is understood from FIG. 14 that the unnecessary current is significantly reduced in the present embodiment as compared with the known example. For example, the magnitude of the unnecessary current in the present embodiment is about one tenth of the magnitude of the unnecessary current in the known example.

As described above, according to the present embodiment, the backlight (light-emitting device) 40 that can suppress the occurrence of the abnormal lighting in which the LED 4 to be turned off is faintly turned on due to the change in the voltage of the anode line AL can be realized.

1.4 Modified Examples

A modified example of the first embodiment will be described below.

1.4.1 First Modified Example

In the first embodiment, during the period in which the power supply voltage VLED is applied to the anode line AL, the second switching element 442 corresponding to the anode line AL is maintained in the ON state. However, according to such a configuration, since the current flowing from the anode line AL to the ground is generated during the period in which the power supply voltage VLED is applied to the anode line AL, power is unnecessarily consumed. Thus, in the present modified example, during the period in which the power supply voltage VLED is applied to the anode line AL, the second switching element 442 corresponding to the anode line AL is maintained in the OFF state.

Figure 15:
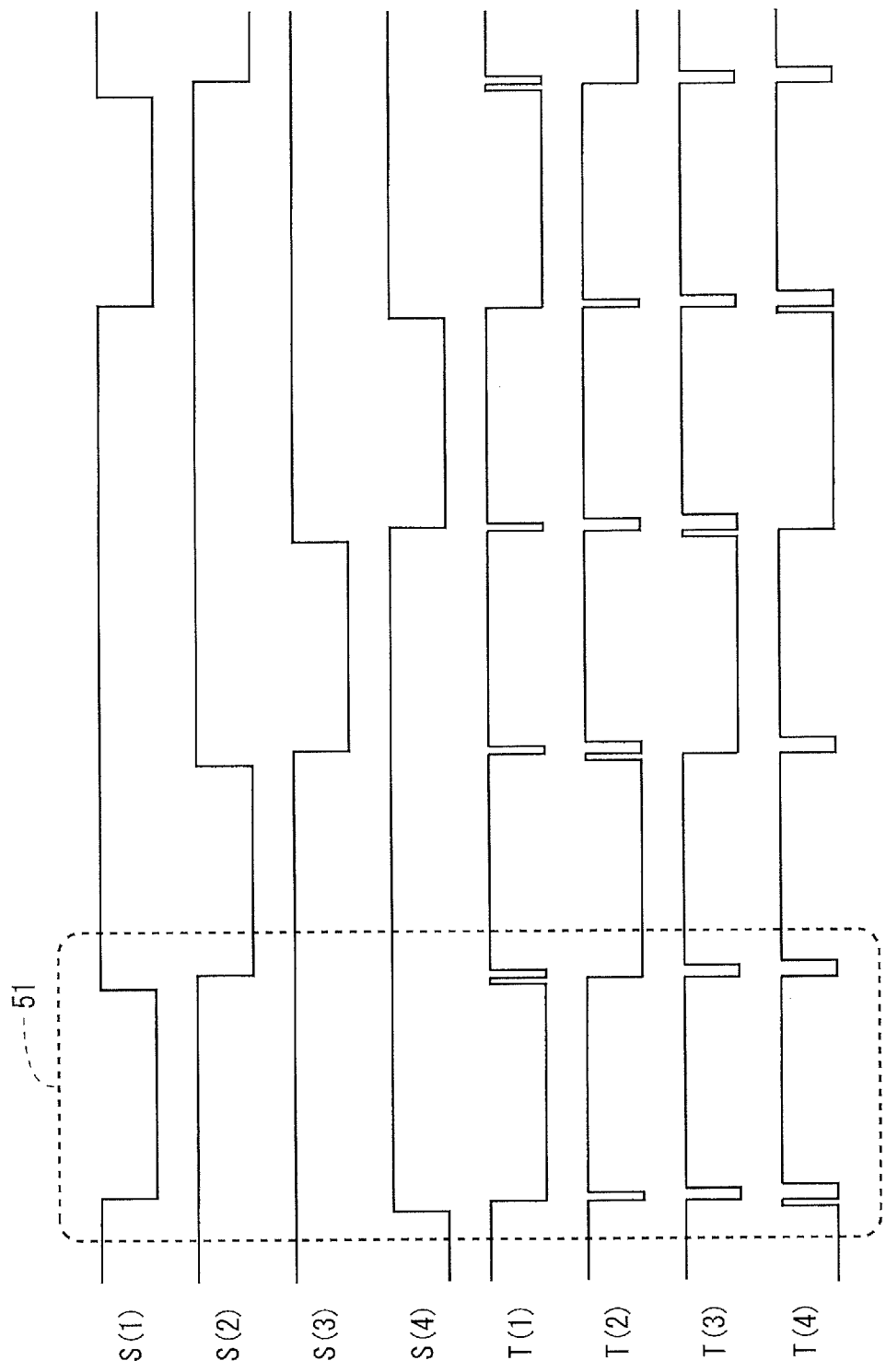
FIG. 15 is a waveform diagram of the switching control signals (the first control signal and the second control signal) in a first modified example of the first embodiment.

FIG. 15 is a waveform diagram of the switching control signal SWCTL (the first control signals S and the second control signals T) in the present modified example. In the present modified example, as in the first embodiment, as a result of the first control signal S(1), the first control signal S(2), the first control signal S(3), and the first control signal S(4) being sequentially set to the low level for the predetermined period at a time, the LEDs of the first row, the LEDs of the second row, the LEDs of the third row, and the LEDs of the fourth row are sequentially set to the lighting-enabled state for the predetermined period at a time.

Figure 16:
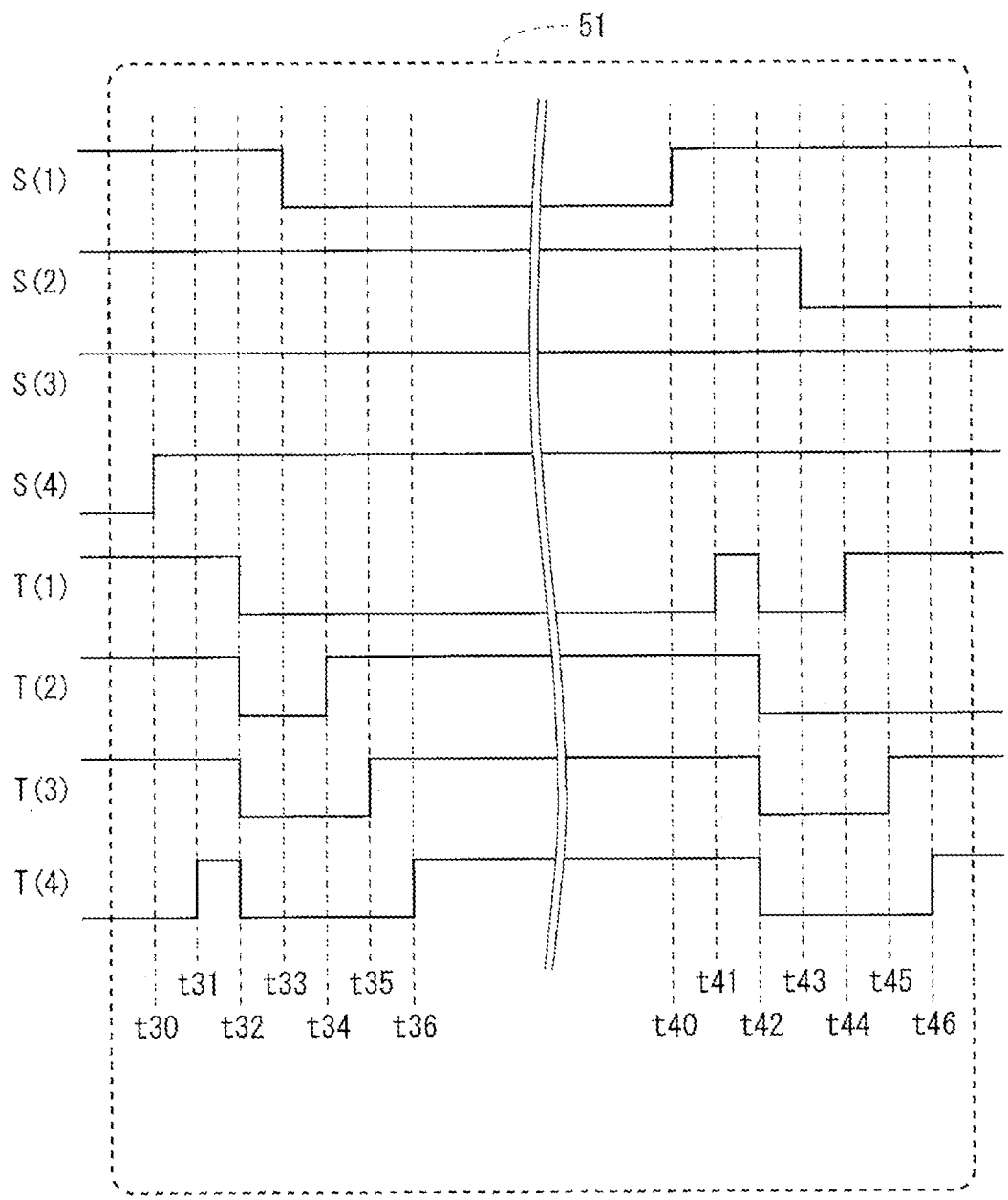
FIG. 16 is a detailed waveform diagram of a portion indicated by a reference sign 51 in FIG. 15.

FIG. 16 is a detailed waveform diagram of a portion indicated by a reference sign 51 in FIG. 15. During a period immediately before a time t30, the first control signal S(4) is at the low level. Therefore, the first switching element 441(4) is in the ON state, and thus the LEDs of the fourth row are in the lighting-enabled state. At the time t30, the first control signal S(4) changes from the low level to the high level. As a result, the first switching element 441(4) is turned off. At this time, the second control signal T(4) is at the low level, and thus the second switching element 442(4) is in the OFF state. At a time t31, the second control signal T(4) changes from the low level to the high level. As a result, the second switching element 442(4) is turned on. As a result, the voltage of the anode line AL(4) decreases, and the LEDs of the fourth row are set to the lighting-disabled state.

At a time t32, the second control signals T(1) to T(4) change from the high level to the low level. As a result, the second switching elements 442(1) to 442(4) are turned off. During a period from a time t33 to a time 36, the same operations as those performed during a period from the time t13 to the time t16 in the first embodiment (see FIG. 12) are performed. However, since the second control signal T(1) is maintained at the low level after the time t32, the second switching element 442(1) is maintained in the OFF state.

Thereafter, at a time t40, the first control signal S(1) changes from the low level to the high level. As a result, the first switching element 441(1) is turned off. At this time, the second control signal T(1) is at the low level, and thus the second switching element 442(1) is in the OFF state. At a time t41, the second control signal T(1) changes from the low level to the high level. As a result, the second switching element 442(1) is turned on. As a result, the voltage of the anode line AL(1) decreases, and the LEDs of the first row are set to the lighting-disabled state.

At a time t42, the second control signals T(1) to T(4) change from the high level to the low level. As a result, the second switching elements 442(1) to 442(4) are turned off. During a period from a time t43 to a time 46, the same operations as those performed during a period from the time t23 to the time t26 in the first embodiment (see FIG. 12) are performed. However, since the second control signal T(2) is maintained at the low level after the time t42, the second switching element 442(2) is maintained in the OFF state.

According to the present modified example, as described above, when the supply destination of the power supply voltage VLED is switched from the above-described first anode line of interest to the above-described second anode line of interest, during the period from the time at which the first switching element 441 corresponding to the first anode line of interest has changed from the ON state to the OFF state based on the first control signal S to the time at which the first switching element 441 corresponding to the second anode line of interest changes from the OFF state to the ON state based on the first control signal S, the plurality of second switching elements 442 respectively corresponding to the plurality of anode lines AL change from the ON state to the OFF state based on the second control signals T after the second switching element 442 corresponding to the first anode line of interest has changed from the OFF state to the ON state based on the second control signals T, and during the period after the time at which the first switching element 441 corresponding to the second anode line of interest has changed from the OFF state to the ON state based on the first control signal S, the plurality of second switching elements 442 respectively corresponding to the plurality of anode lines other than the second anode line of interest change from the OFF state to the ON state based on the second control signals T. Then, the second switching element 442 corresponding to the second anode line of interest is maintained in the OFF state based on the second control signal T during a period in which the power supply voltage VLED is supplied to the second anode line of interest. As described above, during the period in which the power supply voltage VLED is supplied to the anode line AL, no current is generated that flows from that anode line AL to the ground. As a result, the amount of power consumption is reduced even further than in the first embodiment.

1.4.2 Second Modified Example

In the first embodiment, the liquid crystal display device using the backlight that uses the LEDs as the light source is described as an example, but the present disclosure is not limited to this example. The present disclosure can also be applied to an LED display device, which is a display device using LEDs as pixels. Thus, as a second modified example, an example in which the present disclosure is applied to the LED display device will be described.

Figure 17:
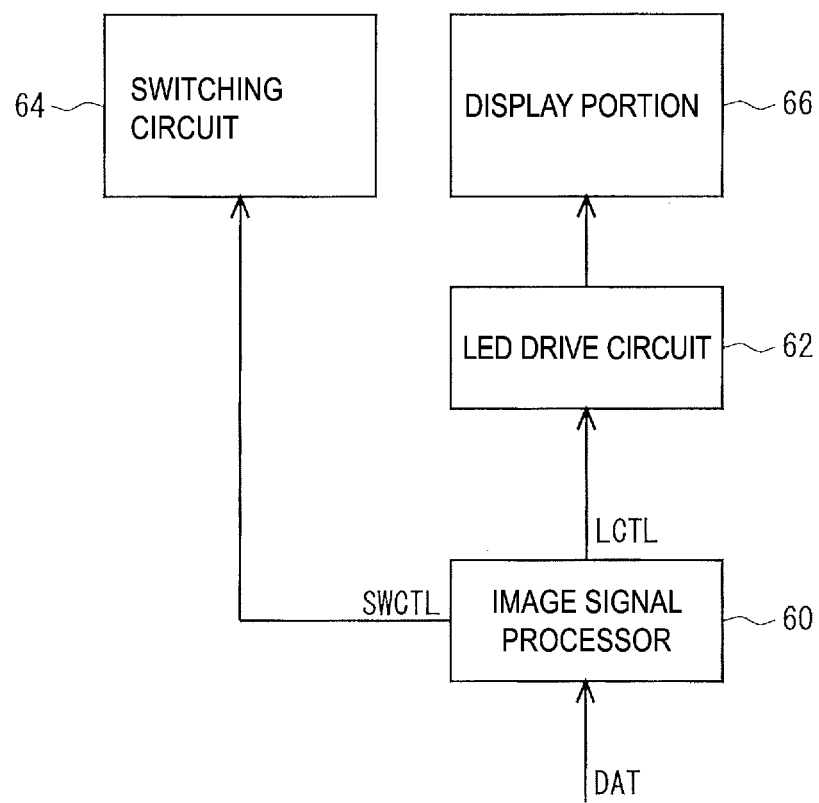
FIG. 17 is a block diagram illustrating an overall configuration of an LED display device according to a second modified example of the first embodiment.

FIG. 17 is a block diagram illustrating an overall configuration of the LED display device according to the present modified example. As illustrated in FIG. 17, this LED display device includes a video signal processor 60, an LED drive circuit 62, a switching circuit 64, and a display portion 66.

The video signal processor 60, the LED drive circuit 62, the switching circuit 64, and the display portion 66 correspond to the control unit 10, the LED drive circuit 420, the switching circuit 440, and the illumination unit 460 in the first embodiment (see FIG. 2), respectively. Thus, the display portion 66 in the present modified example is constituted by a plurality of LED units, a plurality of anode lines, and a plurality of lighting control lines. Each of the LED units is constituted by one or more of the LEDs.

The image signal processor 60 receives the image data DAT sent from the outside, and outputs the luminance control signal LCTL for controlling an operation of the LED drive circuit 62, and the switching control signal SWCTL for controlling an operation of the switching circuit 64. Each of the luminance control signal LCTL and the switch control signal SWCTL is constituted by a plurality of control signals. The LED drive circuit 62 controls the luminance of each of the LEDs in the display portion 66 (controls the current supplied to each of the LEDs) based on the luminance control signal LCTL sent from the video signal processor 60. Based on the switching control signal SWCTL sent from the video signal processor 60, using the time division, the switching circuit 64 switches the supply destination of the power supply voltage between the plurality of anode lines, during the one lighting period. The switching circuit 64 also has a function of controlling the flow of the charge so as to suppress the occurrence of the above-described second type abnormal lighting.

The display portion 66 includes the plurality of LED units as described above, and as in the first embodiment, the operations of the LED drive circuit 62 and the switching circuit 64 are controlled so that the LED in each of the LED units is turned on at the desired luminance.

Incidentally, in the present modified example, the plurality of LED units provided in the display portion 66 are classified into three types. More specifically, the plurality of LED units are classified into a red LED unit including a red LED emitting red light, a green LED unit including a green LED emitting green light, and a blue LED unit including a blue LED emitting blue light. Further, the plurality of LED units described above are arranged such that one picture element includes the red LED unit, the green LED unit, and the blue LED unit. Thus, as a result of the LEDs in the plurality of LED units being turned on at the desired luminance, an image is displayed on this display portion 66. Note that one picture element can also include the LED units of four or more types of colors.

According to the present modified example, an LED display device is realized that can suppress the occurrence of the abnormal lighting in which the LED 4 to be turned off is faintly turned on due to the change in the voltage of the anode line AL.

2. Second Embodiment

2.1 Overview

As described above (see the above description regarding the first modified example), according to the first embodiment, throughout the period in which the power supply voltage VLED is applied to the anode line AL, the second switching element 442 corresponding to the anode line AL is maintained in the ON state, and thus the power is unnecessarily consumed. Further, the greater the resistance value of the second resistor R2, the longer the time required for the voltage of the anode line AL to fall. For example, when the resistance value of the second resistor R2 is 10 kΩ, it takes several tens to several hundreds of microseconds for the voltage of the anode line AL to fall. When the voltage of one anode line AL increases before the voltage of another anode line AL sufficiently decreases, the above-described first type abnormal lighting occurs. If a time period from a time at which the voltage of the first anode line of interest starts to fall to a time at which the voltage of the second anode line of interest starts to rise is lengthened in order to suppress the occurrence of the first type abnormal lighting, the lighting-enabled period of the LED results in being shortened. A technique for solving such a problem is disclosed in US 2020/0257167 A, but the technique disclosed in US 2020/0257167 A cannot suppress the occurrence of the above-described second type abnormal lighting. Thus, an embodiment that can suppress the occurrence of both the first type abnormal lighting and the second type abnormal lighting will be described as a second embodiment.

2.2 Configuration

The overall configuration and the configuration of each of the circuits constituting the backlight 40 are the same as those of the first embodiment described above (see FIGS. 1 to 10). However, the resistance values of the resistors (the first resistors R1 and the second resistors R2) included in the switching circuit 440 are different from those in the first embodiment. Specifically, although the resistance value of the first resistor R1 is from 100Ω to 10 kΩ in the first embodiment, the resistance value of the first resistor R1 is from 100Ω to 1 kΩ in the present embodiment. The reason why the resistance value of the first resistor R1 is set to be 1Ω or less is to prevent a delay in the rise of the voltage of the anode line AL. Further, although the resistance value of the second resistor R2 is from 1 to 10 kΩ in the first embodiment, the resistance value of the second resistor R2 is from 100Ω to 1 kΩ in the present embodiment. Specifically, in the present embodiment, the second resistor R2 having a lower resistance value than that in the first embodiment is used. The reason why the resistance value of the second resistor R2 is set to be 1 kΩ or less is to prevent a delay in the fall of the voltage of the anode line AL. Note that more specific resistance values of the first resistor R1 and the second resistor R2 are preferably determined appropriately using an actual circuit.

2.3 Method for Controlling Lighting of LEDs

Figure 18:
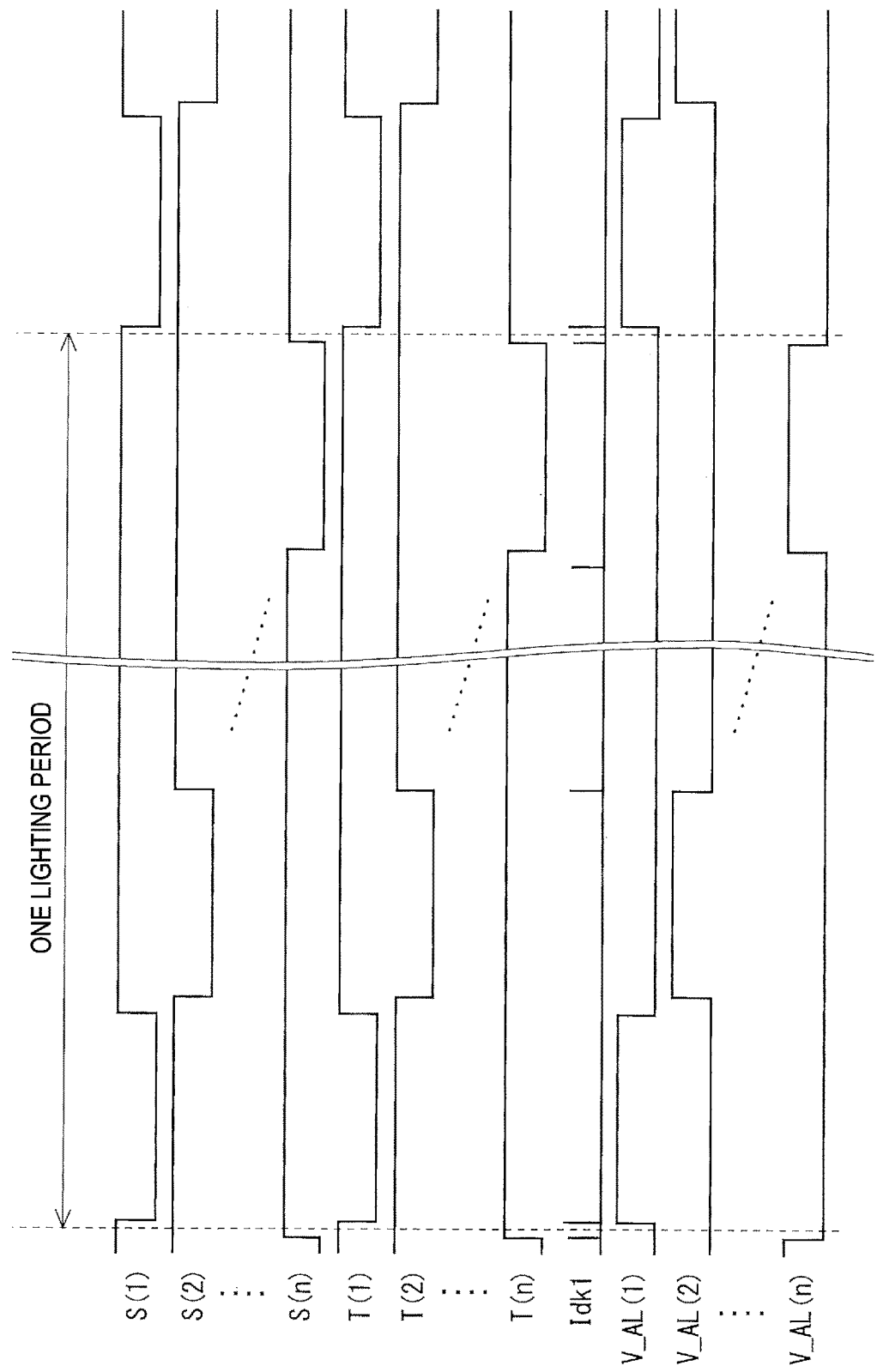
FIG. 18 is a waveform diagram in a first comparative example regarding a second embodiment.

First, as a first comparative example, a case in which a driving method of a second embodiment of US 2020/0257167 (see FIG. 13) is employed will be described. FIG. 18 is a waveform diagram of the first comparative example. Referring to the current Idk1 flowing through the LEDs of the first row (LEDs to be turned off) in FIG. 18, it is understood that an unnecessary current flows through the LED at the rising phase of the voltage of the anode line AL connected to that LED and at the falling phase of the voltages of the anode lines AL not connected to that LED.

Figure 19:
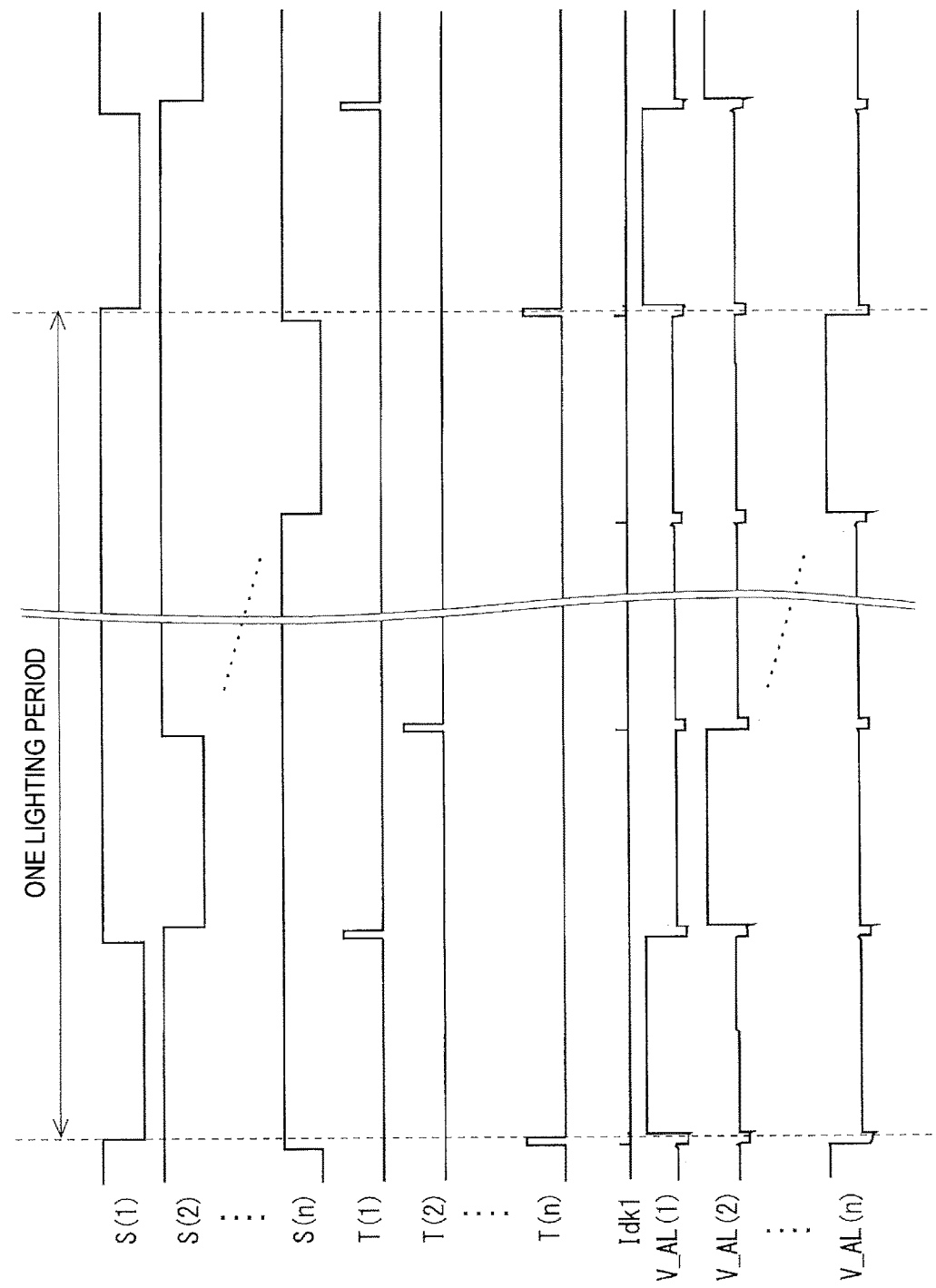
FIG. 19 is a waveform diagram in a second comparative example regarding the second embodiment.

Next, as a second comparative example, a case in which a driving method of a first embodiment of US 2020/0257167 A (see FIG. 10) is employed will be described. FIG. 19 is a waveform diagram of the second comparative example. In the second comparative example, the second switching element 442 corresponding to the first anode line of interest is in the ON state during a period from a time at which the voltage of the first anode line of interest starts falling to a time at which the voltage of the second anode line of interest starts rising. Referring to the current Idk1 flowing through the LEDs of the first row (LED to be turned off) in FIG. 19, it is understood that an unnecessary current flows through the LEDs when the voltages of the anode lines AL not connected to those LEDs falls.

Next, with reference to FIG. 20, an operation performed when switching of the supply destination, that is, the anode lines AL to which the power supply voltage VLED is supplied will be described. Here, attention is paid to an operation performed when switching the supply destination of the power supply voltage VLED from the anode line AL(2) to the anode line AL(3).

In a period immediately before a time t51, the first control signal S(2) is at the low level. Thus, the first switching element 441(2) is in the ON state, and the power supply voltage VLED is supplied to the anode line AL(2). Thus, the voltage V_AL(2) of the anode line AL(2) is at the high level. Further, the second control signal T(2) is at the low level. Thus, the second switching element 442(2) is in the OFF state.

At a time t51, the second control signal T(2) changes from the low level to the high level. As a result, the second switching element 442(2) is turned on. At a time t52 arriving after a period Ta has elapsed from the time t51, the first control signal S(2) changes from the low level to the high level. As a result, the first switching element 441(2) is turned off, and the voltage V_AL(2) of the anode line AL(2) decreases. Note that the length of the period Ta is several microseconds.

At a time t53, the second control signal T(2) changes from the high level to the low level. As a result, the second switching element 442(2) is turned off. Note that at the time t53, the voltage V_AL(2) of the anode line AL(2) has sufficiently fallen. Thereafter, at a time t54, the first control signal S(3) changes from the high level to the low level. As a result, the first switching element 441(3) is turned on, and as a result of the power supply voltage VLED being supplied to the anode line AL(3), the voltage V_AL(3) of the anode line AL(3) increases.

Figure 20:
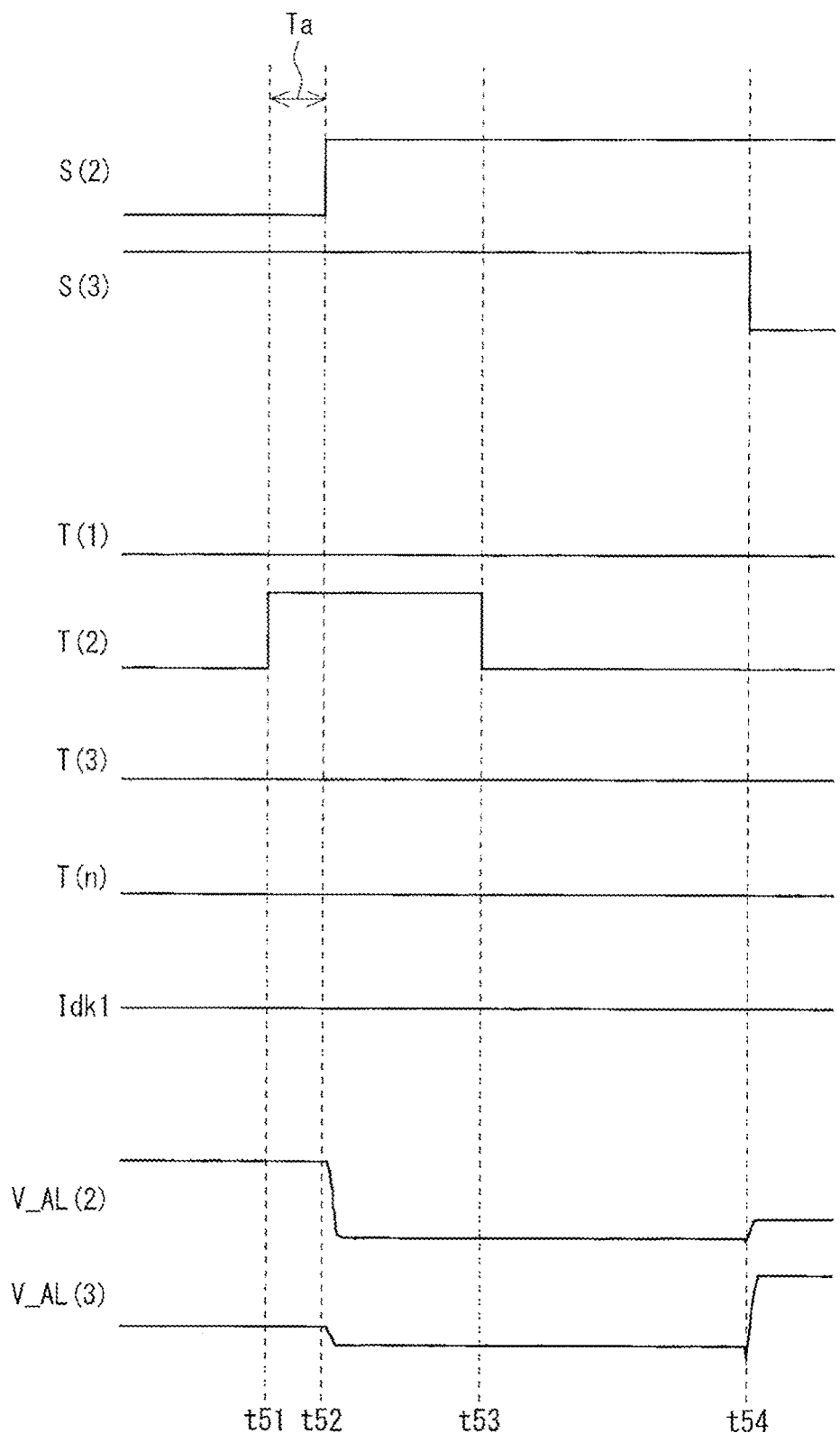
FIG. 20 is a waveform diagram for describing an operation when an anode line of a supply destination of a power supply voltage is switched in the second embodiment.

As understood from FIG. 20, according to the present embodiment, when the supply destination of the power supply voltage VLED is switched from the first anode line of interest to the second anode line of interest, the second switching element 442 corresponding to the first anode line of interest changes from the OFF state to the ON state based on the second control signal T during a period before the first switching element 441 corresponding to the first anode line of interest changes from the ON state to the OFF state based on the first control signal S, and the second switching element 442 corresponding to the first anode line of interest changes from the ON state to the OFF state based on the second control signal T during a period from the time at which the first switching element 441 corresponding to the first anode line of interest changes from the ON state to the OFF state based on the first control signal S to a time at which the first switching element 441 corresponding to the second anode line of interest changes from the OFF state to the ON state based on the first control signal S. Further, the second switching element 442 corresponding to the first anode line of interest is maintained in the OFF state based on the second control signal T during a period other than the predetermined period in which the supply destination of the power supply voltage VLED is switched from the first anode line of interest to the second anode line of interest.

As described above, for example, the second control signal T(2) is changed from the low level to the high level slightly before the first control signal S(2) is changed from the low level to the high level. The reason why such control is performed is that when the second control signal T(2) changes from the low level to the high level after the first control signal S(2) changes from the low level to the high level, the voltage of the anode line AL(2) may rapidly fall depending on the switching characteristics of the second switching element 442, and a current may flow through the LEDs 4 connected to the anode lines other than the anode line AL(2). By increasing the resistance value of the second resistor R2, the rapid voltage fall of the anode line AL can be suppressed. However, when the resistance value of the second resistor R2 is increased, as a result of the time required for the voltage of the anode line AL to sufficiently fall being lengthened, there is a concern that the above-described first type of abnormal lighting may occur. Thus, in each of the anode line control circuits, the second control signal T is changed from the low level to the high level several microseconds before the first control signal S is changed from the low level to the high level. Note that, in each of the anode line control circuits, a period occurs in which both the first switching element 441 and the second switching element 442 are in the ON state (a period from the time t51 to the time t52 in FIG. 20, for example), and during this period, a current of a magnitude determined by the resistance value of the second resistor R2 and the power supply voltage VLED flows through the second resistor R2. In this regard, if the resistance value of the second resistor R2 is low, a large current that causes a circuit breakdown may flow through the second resistor R2. Thus, a resistor having a resistance value of 100 Ω or more is employed as the second resistor R2. When the resistance value of the second resistor R2 is from 100Ω to 1 kΩ as described above, the time required for the voltage of the anode line AL to fall is within several microseconds.

2.4 Effects

Figure 21:
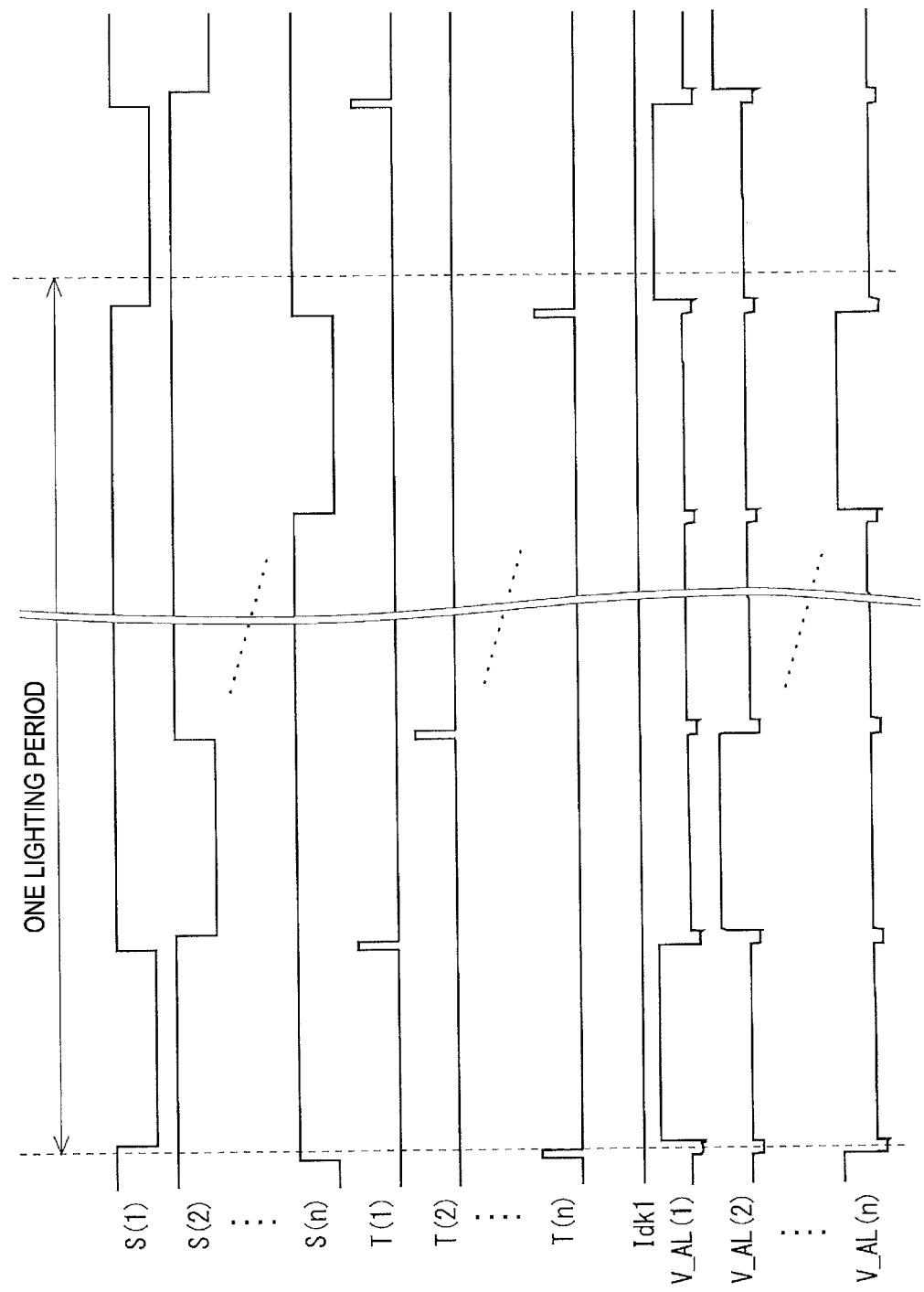
FIG. 21 is a waveform diagram for describing an effect of the second embodiment.

FIG. 21 illustrates waveforms of the first control signals S(1) to S(n), the second control signals T(1) to T(n), the current Idk1 flowing through the LEDs of the first row (LEDs to be turned off), and the voltages V_AL(1) to V_AL(n) of the anode lines AL(1) to AL(n), in this embodiment. Referring to the current Idk1 flowing through the LEDs of the first row in FIG. 21, it is understood that almost no unnecessary current is generated.

Figure 22:
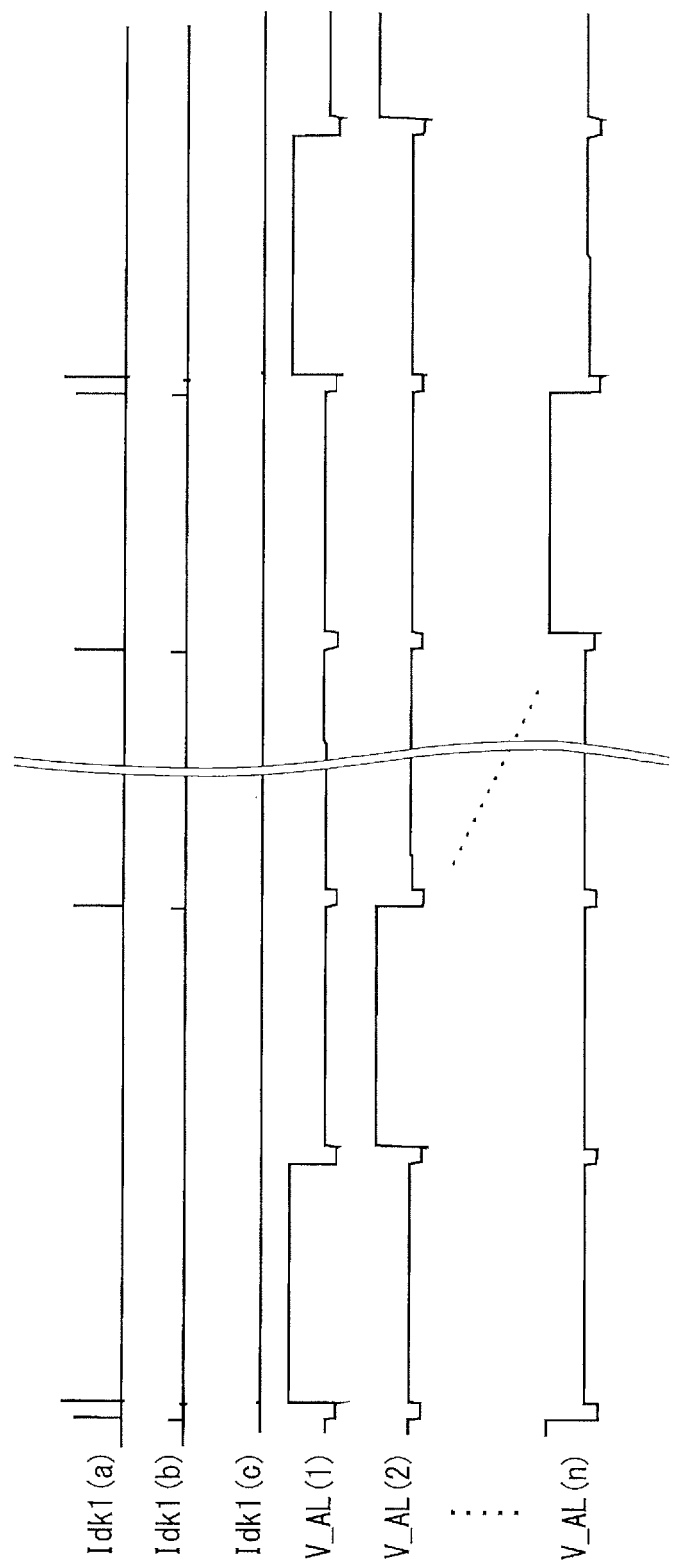
FIG. 22 is a waveform diagram for describing the effect of the second embodiment.

With reference to FIG. 22, a difference in the current Idk1 between the method disclosed in US 2020/0257167 A and the present embodiment will be described. In FIG. 22, the current Idk1 in the case in which the driving method of the second embodiment of US 2020/0257167 (see FIG. 13) is employed is indicated by Idk1($a$), the current Idk1 in the case in which the driving method of the first embodiment of US 2020/0257167 (see FIG. 10) is employed is indicated by Idk1($b$), and the current Idk1 in the present embodiment is indicated by Idk1($c$). It is understood from FIG. 22 that, according to the present embodiment, the unnecessary current is significantly reduced as compared with the methods disclosed in US 2020/0257167 A.

From FIGS. 21 and 22, it is understood that the occurrence of the first type abnormal lighting is suppressed, and also, the occurrence of the second type abnormal lighting is suppressed. Further, during most of the period in which the power supply voltage VLED is applied to the anode line A, the second switching element 442 corresponding to the anode line AL is maintained in the OFF state. As a result, the power consumption during the period in which the power supply voltage VLED is applied to the anode line AL is reduced as compared with the first embodiment.

As described above, according to the present embodiment, a low power consumption backlight (light-emitting device) can be realized, and this backlight can suppress the occurrence of abnormal lighting (occurrence of the first type abnormal lighting) in which the LED 4, which is located in the same column as the LED 4 to be turned on and is driven before the LED 4 to be turned on, is faintly turned on even though that LED 4 is supposed to be turned off, and also can suppress the occurrence of abnormal lighting (occurrence of the second type abnormal lighting) in which the LED 4 that is supposed to be turned off is faintly turned on due to the change in the voltage of the anode line AL.

3. Third Embodiment

3.1 Overall Configuration

Figure 23:
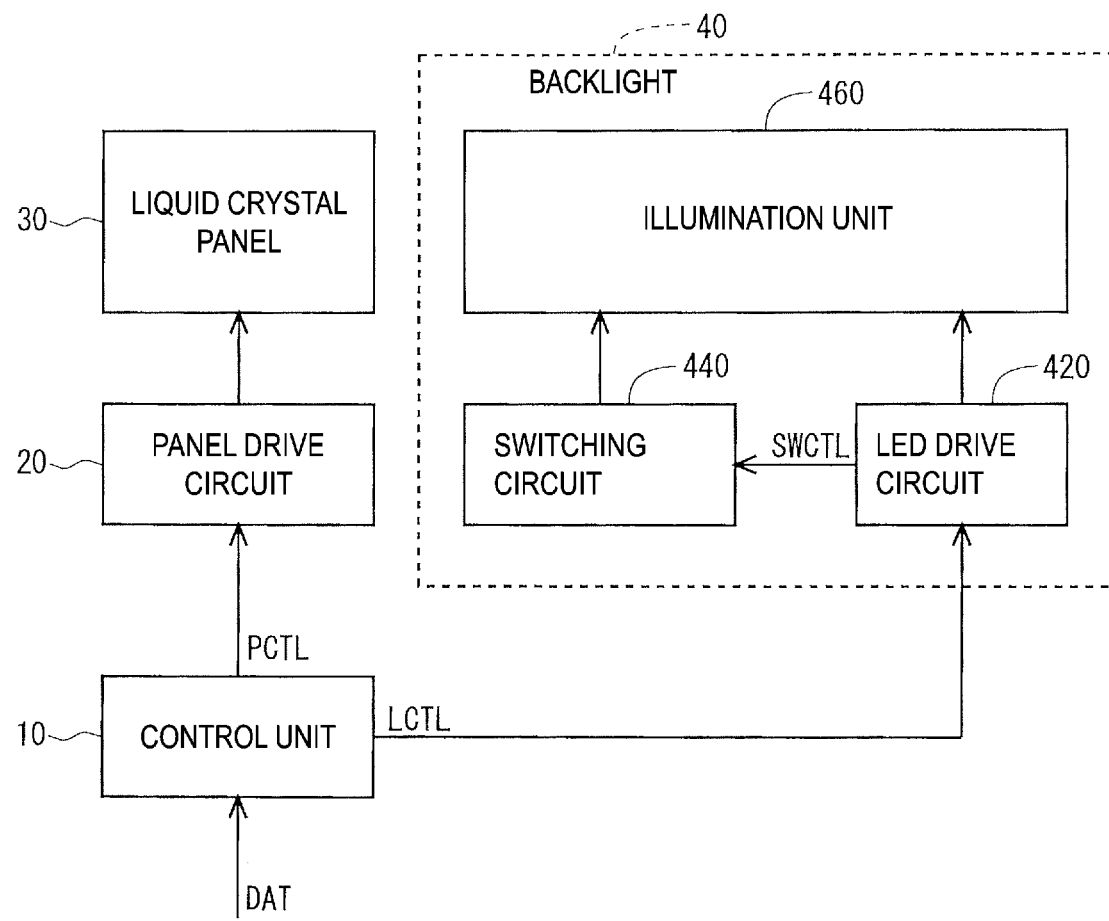
FIG. 23 is a block diagram illustrating an overall configuration of a liquid crystal display device according to a third embodiment.

FIG. 23 is a block diagram illustrating an overall configuration of a liquid crystal display device according to a third embodiment. The overall configuration in the present embodiment is substantially the same as that of the first embodiment. However, although the switching control signal SWCTL is applied from the control unit 10 to the switching circuit 440 in the first embodiment, the switching control signal SWCTL is applied from the LED drive circuit 420 to the switching circuit 440 in the present embodiment. Note that, as in the first embodiment, the switching control signal SWCTL may be applied from the control unit 10 to the switching circuit 440 in the present embodiment.

Figure 24:
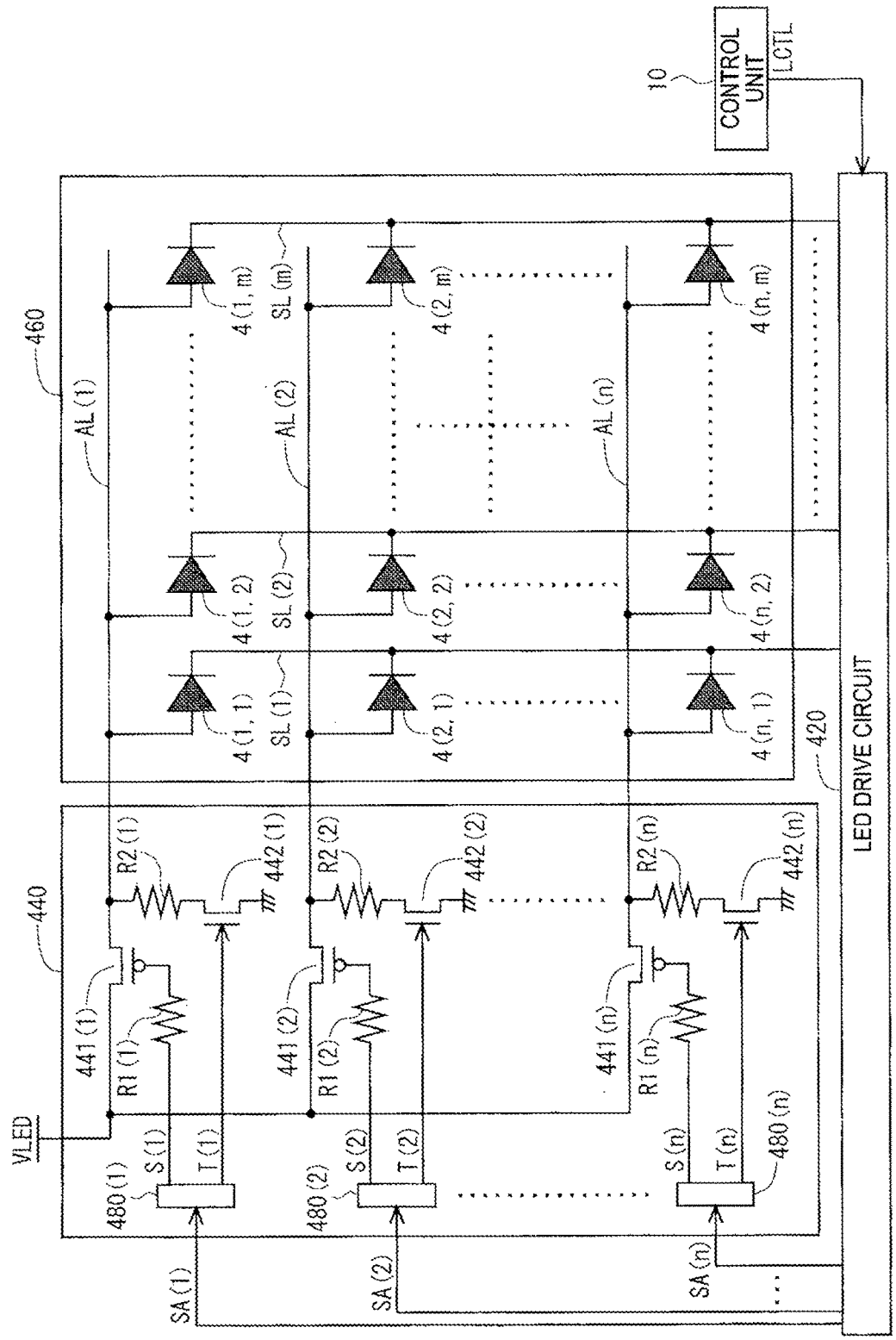
FIG. 24 is a block diagram for describing a configuration of a backlight in the third embodiment.

FIG. 24 is a diagram for describing a configuration of the backlight 40 according to the present embodiment. The LED drive circuit 420 and the illumination unit 460 are configured in the same manner as in the first embodiment. The switching circuit 440 is provided with n adjustment circuits 480(1) to 480($n$) in addition to the constituent elements in the first embodiment. Adjustment signals SA(1) to SA(n) are applied to the adjustment circuits 480(1) to 480($n$) as the switching control signal SWCTL, respectively. Then, in the adjustment circuits 480(1) to 480($n$), the above-described first control signals S(1) to S(n) and second control signals T(1) to T(n) are generated. Note that, in the present embodiment, it is assumed that the adjustment circuits 480 are configured such that the first control signals S(1) to S(n) and the second control signals T(1) to T(n) have the same waveforms as in the second embodiment (see FIG. 20).

Figure 25:
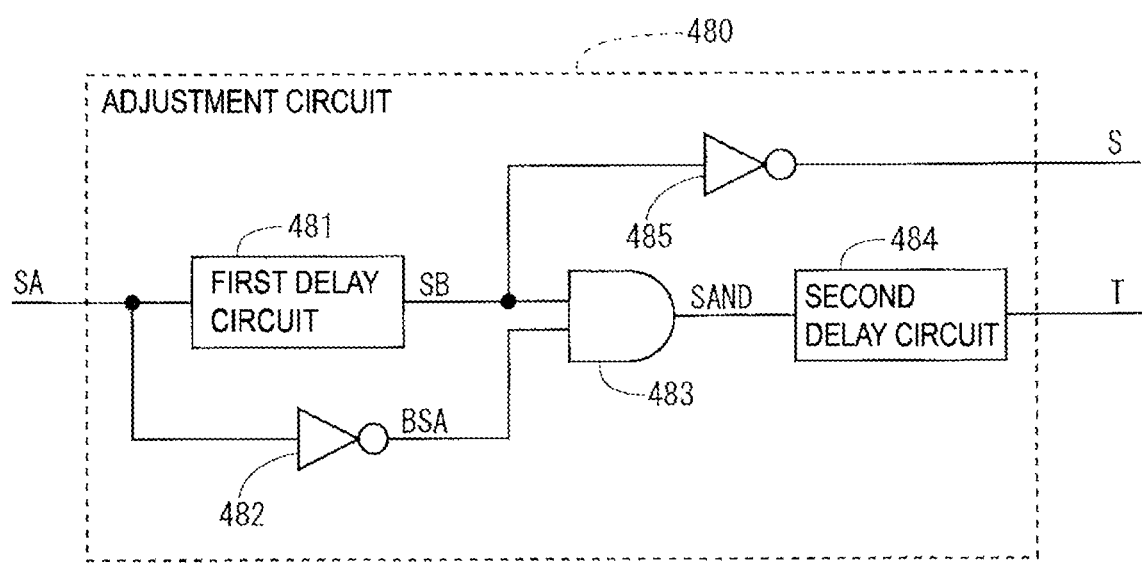
FIG. 25 is a circuit diagram illustrating a configuration example of an adjustment circuit in the third embodiment.

FIG. 25 is a circuit diagram illustrating a configuration example of the adjustment circuit 480. As illustrated in FIG. 25, the adjustment circuit 480 includes a first delay circuit 481, a NOT circuit 482, an AND circuit 483, a second delay circuit 484, and a NOT circuit 485. The first delay circuit 481 outputs a signal SB, which is generated by delaying the adjustment signal SA by predetermined p microseconds. The NOT circuit 482 outputs a signal BSA, which is a logical inversion signal of the adjustment signal SA. The AND circuit 483 outputs a signal SAND representing a logical product of the signal SB and the signal BSA. The second delay circuit 484 outputs a signal, which is generated by delaying the signal SAND by predetermined q microseconds, as the second control signal T. The NOT circuit 485 outputs a logical inversion signal of the signal SB, as the first control signal S. Typically, p has a value of less than 10, and q has a value of approximately one half of p. Note that p microseconds corresponds to a first time period, and q microseconds corresponds to a second time period.

3.2 Operation of Adjustment Circuit

Figure 26:
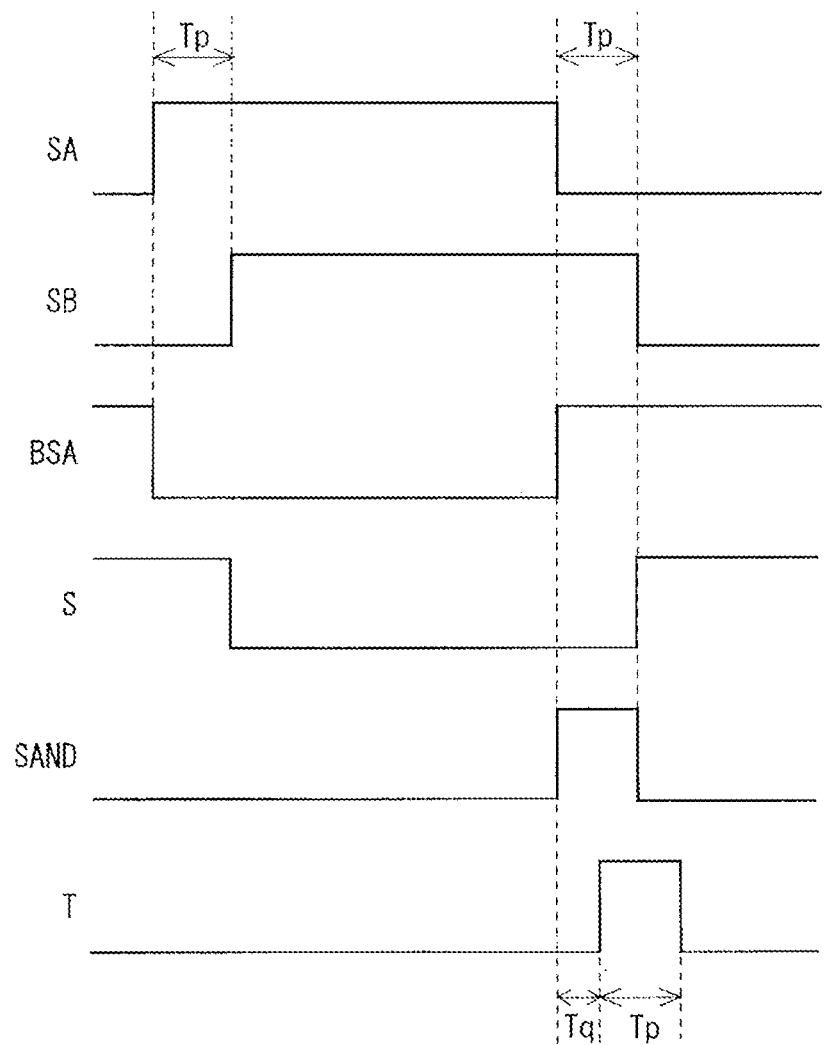
FIG. 26 is a signal waveform diagram for describing an operation of the adjustment circuit in the third embodiment.

FIG. 26 is a signal waveform diagram for describing an operation of the adjustment circuit 480. In FIG. 26, the length of a period indicated by arrows denoted by a reference sign Tp is p microseconds, and the length of a period indicated by arrows denoted by a reference sign Tq is q microseconds. The adjustment signal SA is maintained at the high level only during a period having the length equal to the length of the lighting-enabled period of the LED 4 included in each of the blocks, and is maintained at the low level during the other periods. The signal SB changes from the low level to the high level p microseconds after a time at which the adjustment signal SA has changed from the low level to the high level, and changes from the high level to the low level p microseconds after a time at which the adjustment signal SA has changed from the high level to the low level. The signal BSA changes from the high level to the low level at a time at which the adjustment signal SA has changed from the low level to the high level, and changes from the low level to the high level at a time at which the adjustment signal SA has changed from the high level to the low level. The first control signal S changes from the high level to the low level at a time at which the signal SB has changed from the low level to the high level, and changes from the low level to the high level at a time at which the signal SB has changed from the high level to the low level. The signal SAND changes from the low level to the high level at a time at which the signal BSA has changed from the low level to the high level, and changes from the high level to the low level at a time at which the signal SB has changed from the high level to the low level. The second control signal T changes from the low level to the high level q microseconds after a time at which the signal SAND has changed from the low level to the high level, and changes from the high level to the low level q microseconds after a time at which the signal SAND has changed from the high level to the low level. With the configuration described above, the second control signal T changes from the low level to the high level (p-q) microseconds before the first control signal S changes from the low level to the high level, and changes from the high level to the low level q microseconds after the time at which the first control signal S changes from the low level to the high level.

Based on the first control signals S(1) to S(n) and the second control signals T(1) to T(n) that are generated by the adjustment circuits 480 operating as described above, lighting of the LEDs 4 in the illumination unit 460 is controlled in the same manner as in the second embodiment.

3.3 Effects

According to this embodiment, the number of signal lines required between the control unit 10 and the backlight 40 can be reduced. As a result, the same effects as those of the second embodiment can be achieved, and downsizing of a module can also be achieved as an additional effect.

4. Other

Although the disclosure has been described in detail above, the above description is exemplary in all respects and is not limited thereto. It is understood that numerous other modifications or variations can be made without departing from the scope of the disclosure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A light-emitting device using an LED as a light source, the light-emitting device comprising:
   a plurality of LED units each constituted by one or a plurality of LEDs, the plurality of LEDs being divided up into a plurality of blocks;
   a plurality of power supply lines provided corresponding to the plurality of blocks in a one-to-one manner, and connected to upstream ends of the LED units included in the corresponding blocks;
   a switching circuit configured to switch, between the plurality of power supply lines, a supply destination of a power supply voltage for driving the LEDs, to drive the plurality of LED units a block at a time;
   a plurality of lighting control lines respectively connected to downstream ends of a number of the LED units equal to a number of the plurality of blocks; and
   an LED drive circuit configured to control a current supplied to the LED included in each of the plurality of LED units, the LED drive circuit being connected to the plurality of lighting control lines,
   wherein the switching circuit includes a plurality of power supply line control circuits provided corresponding to the plurality of power supply lines in a one-to-one manner,
   each of the power supply line control circuits includes
   a first switching element including a control terminal, a first conduction terminal to which the power supply voltage is applied, and a second conduction terminal connected to the corresponding power supply line,
   a first resistor, a first control signal being applied to one end of the first resistor and the other end of the first resistor being connected to the control terminal of the first switching element,
   a second switching element including a control terminal to which a second control signal is applied, a first conduction terminal, and a second conduction terminal to which a predetermined potential is applied, and
   a second resistor, one end of the second resistor being connected to the corresponding power supply line and the other end of the second resistor being connected to the first conduction terminal of the second switching element, and
   when, of two of the power supply lines to which the power supply voltage is continuously supplied, the power supply line to which the power supply voltage is supplied first is defined as a first power supply line of interest, and of the two power supply lines, the power supply line to which the power supply voltage is supplied subsequently is defined as a second power supply line of interest, at a time at which the first switching element corresponding to the second power supply line of interest changes from an OFF state to an ON state based on the first control signal, a plurality of the second switching elements respectively corresponding to the plurality of power supply lines other than the second power supply line of interest are maintained in the OFF state based on the second control signals.

2. The light-emitting device according to claim 1, wherein, when the supply destination of the power supply voltage is switched from the first power supply line of interest to the second power supply line of interest,
   during a period from a time at which the first switching element corresponding to the first power supply line of interest changes from the ON state to the OFF state based on the first control signal to a time at which the first switching element corresponding to the second power supply line of interest changes from the OFF state to the ON state based on the first control signal, the plurality of second switching elements respectively corresponding to the plurality of power supply lines other than the second power supply line of interest change from the ON state to the OFF state based on the second control signals, and
   during a period after a time at which the first switching element corresponding to the second power supply line of interest changes from the OFF state to the ON state based on the first control signal, the plurality of the second switching elements respectively corresponding to the plurality of power supply lines other than the second power supply line of interest sequentially change from the OFF state to the ON state based on the second control signals.

3. The light-emitting device according to claim 1, wherein, when the supply destination of the power supply voltage is switched from the first power supply line of interest to the second power supply line of interest, during a period from a time at which the first switching element corresponding to the first power supply line of interest changes from the ON state to the OFF state based on the first control signal to a time at which the first switching element corresponding to the second power supply line of interest changes from the OFF state to the ON state based on the first control signal, after the second switching element corresponding to the first power supply line of interest changes from the OFF state to the ON state based on the second control signal, the plurality of the second switching elements respectively corresponding to the plurality of power supply lines change from the ON state to the OFF state based on the second control signals, during a period after a time at which the first switching element corresponding to the second power supply line of interest changes from the OFF state to the ON state based on the first control signal, the plurality of the second switching elements respectively corresponding to the plurality of power supply lines other than the second power supply line of interest sequentially change from the OFF state to the ON state based on the second control signals, and the second switching element corresponding to the second power supply line of interest is maintained in the OFF state based on the second control signals during a period in which the power supply voltage is supplied to the second power supply line of interest.

4. The light-emitting device according to claim 1, wherein, when the supply destination of the power supply voltage is switched from the first power supply line of interest to the second power supply line of interest, during a period before a time at which the first switching element corresponding to the first power supply line of interest changes from the ON state to the OFF state based on the first control signal, the second switching element corresponding to the first power supply line of interest changes from the OFF state to the ON state based on the second control signal, during a period from a time at which the first switching element corresponding to the first power supply line of interest changes from the ON state to the OFF state based on the first control signal to a time at which the first switching element corresponding to the second power supply line of interest changes from the OFF state to the ON state based on the first control signal, the second switching element corresponding to the first power supply line of interest changes from the ON state to the OFF state based on the second control signal, and the second switching element corresponding to the first power supply line of interest is maintained in the OFF state based on the second control signal during a period excluding a predetermined period during which the supply destination of the power supply voltage is switched from the first power supply line of interest to the second power supply line of interest.

5. The light-emitting device according to claim 1, wherein the switching circuit includes a plurality of adjustment circuits provided corresponding to the plurality of power supply line control circuits in a one-to-one manner, and each of the adjustment circuits generates, based on one adjustment signal, the first control signal and the second control signal supplied to the corresponding power supply line control circuit.

6. The light-emitting device according to claim 5, wherein each of the adjustment circuits includes a first delay circuit configured to output a signal generated by delaying the adjustment signal by a first time period having a predetermined length, a first NOT circuit configured to output a logical inversion signal of the adjustment signal, an AND circuit configured to output a signal representing a logical product of the signal output from the first delay circuit and the signal output from the first NOT circuit, a second delay circuit configured to output, as the second control signal, a signal generated by delaying the signal output from the AND circuit by a second time period having a predetermined length, and a second NOT circuit configured to output, as the first control signal, a logical inversion signal of the signal output from the first delay circuit.

7. A display device comprising:

a display panel including a display portion configured to display an image; and the light-emitting device according to claim 1, provided on a back surface of the display panel to emit light onto the display portion.

8. An LED display device comprising the light-emitting device according to claim 1, wherein the plurality of LED units are classified into K types based on luminescent colors, and each of picture elements is constituted by the K types of the LED units.

\* \* \* \* \*